US012750045B2

(12) United States Patent
Kashmiri et al.

(10) Patent No.: US 12,750,045 B2
(45) Date of Patent: Sep. 29, 2026

(54) SYSTEMS AND METHODS FOR CLOCK GENERATION AND CALIBRATION IN PHOTONIC SYSTEMS

(71) Applicant: Avago Technologies International Sales Pte. Limited, Singapore (SG)

(72) Inventors: Sayyed Mahdi Kashmiri, San Jose, CA (US); Hiva Hedayati, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 19/044,082

(22) Filed: Feb. 3, 2025

(65) Prior Publication Data

US 2026/0230068 A1 Aug. 6, 2026

(51) Int. Cl.

| | |
|---|---|
| ***H03K 5/13*** | (2014.01) |
| ***H03K 5/14*** | (2014.01) |
| ***H03K 5/26*** | (2006.01) |
| *G02F 1/01* | (2006.01) |
| *G02F 1/21* | (2006.01) |
| *H03K 5/00* | (2006.01) |

(52) U.S. Cl.

CPC ................ *H03K 5/14* (2013.01); *H03K 5/26* (2013.01); *G02F 1/0121* (2013.01); *G02F 1/212* (2021.01); *H03K 2005/00078* (2013.01)

(58) Field of Classification Search

CPC .. H03K 5/01; H03K 5/04; H03K 5/05; H03K 5/06; H03K 5/13; H03K 5/131; H03K 5/135; H03K 5/14; H03K 5/22; H03K 5/26; H03K 2005/00013; H03K 2005/00019; H03K 2005/00026; H03K 2005/00058; H03K 2005/00078; G02F 1/0121; G02F 1/212

See application file for complete search history.

(56) References Cited

U.S. PATENT DOCUMENTS

| | | | | |
|---|---|---|---|---|
| 7,598,783 | B2 | 10/2009 | Shin et al. | |
| 8,237,479 | B2 | 8/2012 | Kao et al. | |
| 2011/0316598 | A1* | 12/2011 | Petrie .................... | H03L 7/0814 327/158 |

(Continued)

OTHER PUBLICATIONS

Extended European Search Report for Patent Application No. 26155918.1 dated Jun. 24, 2026, 9 pages.

*Primary Examiner* — Long Nguyen
(74) *Attorney, Agent, or Firm* — Quarles & Brady LLP

(57) ABSTRACT

The subject technology is directed to clock generation and calibration systems and methods. In an embodiment, the subject technology provides an apparatus that includes a first delay line configured to receive an input clock signal and generate a first clock signal by providing a first delay to the input clock signal. The apparatus further includes a second delay line configured to receive the input clock signal and generate a second clock signal by providing a second delay to the input clock signal. A phase detector is coupled to the first and second delay lines to determine a phase difference between the first and second clock signals. A comparator generates an output signal based on the phase difference, and a controller adjusts the first or second delay based on the output signal. The system enables precise phase alignment and skew calibration for clock signals. There are other embodiments as well.

20 Claims, 16 Drawing Sheets

(56) References Cited

U.S. PATENT DOCUMENTS

| | | | | |
|---|---|---|---|---|
| 2021/0200256 | A1* | 7/2021 | Shi | G06F 1/12 |
| 2022/0247390 | A1 | 8/2022 | Kim et al. | |
| 2024/0405777 | A1 | 12/2024 | An | |
| 2024/0419021 | A1 | 12/2024 | Sobu et al. | |

* cited by examiner

SYSTEMS AND METHODS FOR CLOCK GENERATION AND CALIBRATION IN PHOTONIC SYSTEMS

FIELD OF INVENTION

The subject technology is directed to clock generation and calibration systems and methods.

BACKGROUND OF THE INVENTION

High-speed optical communication systems require precise modulation of light signals to ensure reliable data transmission. For instance, segmented mach-zehnder modulators (MZMs) are widely used to achieve high data rates by modulating electrical signals onto optical carriers. Achieving optimal performance in such systems requires accurate clock signal generation and synchronization across multiple MZM segments.

Phase alignment between clock signals, which may be represented by in-phase (I) and quadrature-phase (Q) components, is important for ensuring proper data modulation. Variations in process, temperature, and voltage (PVT) during operation can introduce phase drift and skew between segments of the MZM, resulting in degraded signal integrity and increased bit error rates (BER).

Some approaches rely on static delay adjustments or analog techniques, which lack the flexibility to effectively compensate for PVT variations. Moreover, inter-segment skew calibration is difficult to achieve using analog approaches, such as in co-packaged photonic systems, where precise phase alignment is required across multiple segments. As data rates and system complexity continue to increase, there is a growing need for systems and methods capable of accurate clock generation and calibration to maintain system performance across a wide range of environments.

Various approaches for clock generation and calibration have been explored, but they have proven to be insufficient. It is important to recognize the need for new and improved systems and methods.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1A:
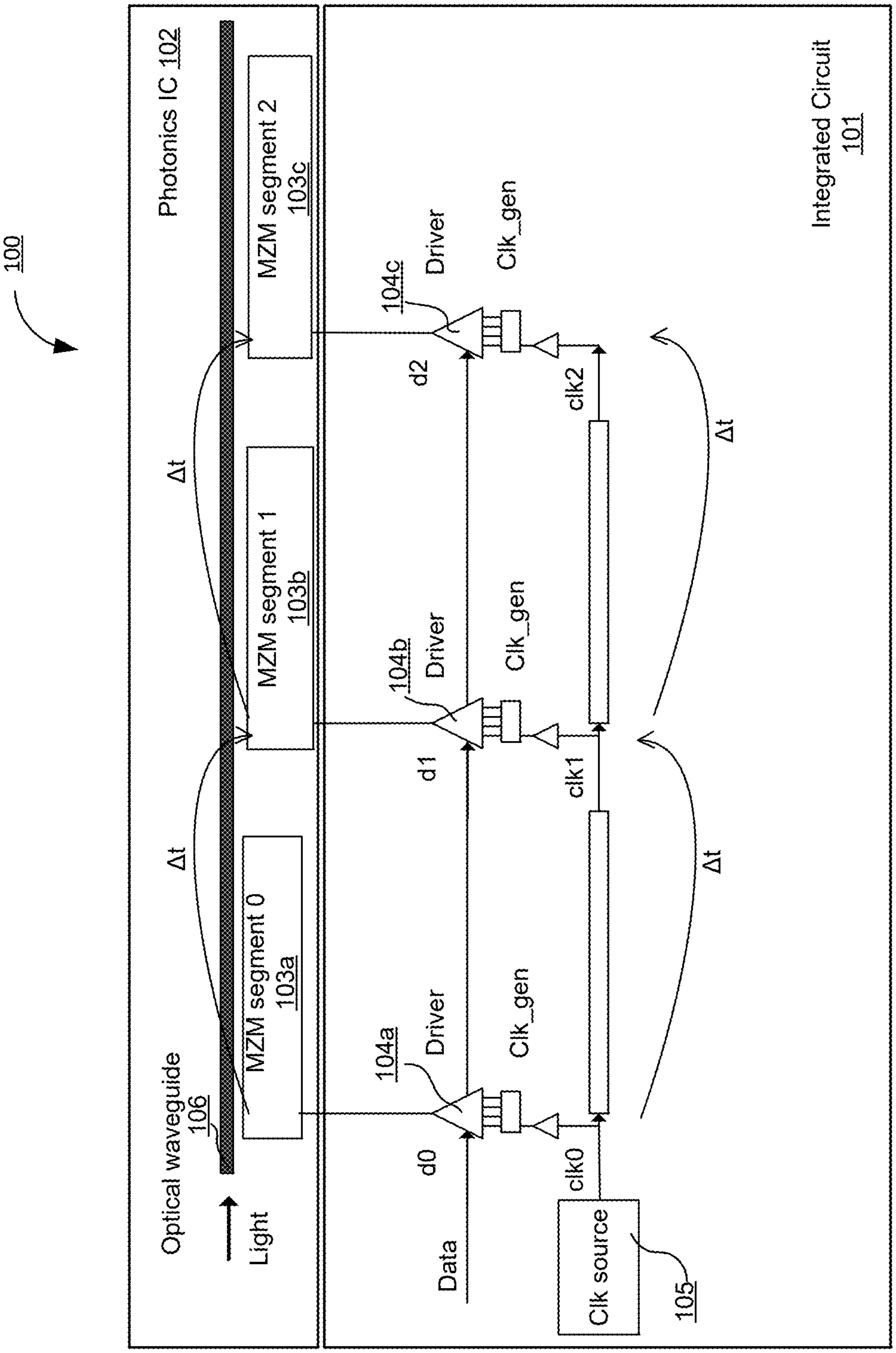
FIG. 1A is a simplified diagram illustrating a co-packaged optical system, according to embodiments of the subject technology.

The subject technology is directed to clock generation and calibration systems and methods. In an embodiment, the subject technology provides an apparatus that includes a first delay line configured to receive an input clock signal and generate a first clock signal by providing a first delay to the input clock signal. The apparatus further includes a second delay line configured to receive the input clock signal and generate a second clock signal by providing a second delay to the input clock signal. A phase detector is coupled to the first and second delay lines to determine a phase difference between the first and second clock signals. A comparator generates an output signal based on the phase difference, and a controller adjusts the first or second delay based on the output signal. The system enables precise phase alignment and skew calibration for clock signals in high-speed communication systems. There are other embodiments as well.

As previously noted, high-speed communication systems rely on precise clock signal generation and calibration to maintain system performance and signal integrity. Mach-zehnder modulators (MZMs) are widely used in these systems to translate digital data into optical signals using pulse amplitude modulation (e.g., PAM4). In various applications, MZMs are segmented to accommodate the higher data rates (e.g., 100 Gbps, 200 Gbps, or higher) and spectral efficiency demanded by modern optical communication systems.

In segmented MZMs, the optical signal is generated by multiple modulator segments, each driven by synchronized multi-phase clock signals. For example, a four-phase clock system may generate in-phase (I), quadrature-phase (Q), inverse in-phase (Ib), and inverse quadrature-phase (Qb) signals based on a high-speed clock source (e.g., a 14 GHz or 28 GHz clock). These multi-phase clocks may be used to serialize high-speed data across the MZM segments. The timing accuracy of the multi-phase clocks is important for the quality of the optical signal, which can be evaluated using the PAM4 eye diagram. Several factors may contribute to this timing accuracy, such as the clock signal's duty cycle, the phase alignment between I and Q components, and/or the synchronization of clock signals across MZM segments (e.g., lane skew). However, environmental factors such as temperature fluctuations, process variations, and component aging may introduce phase drift and skew, leading to distortion of the optical signal and increased bit error rates (BER).

Some approaches for clock generation rely on analog techniques (e.g., analog delay-locked loops (DLLs)) to generate multi-phase clock signals. While effective in some cases, these analog techniques have inherent limitations. For instance, analog circuits are sensitive to input-referred offsets and environmental factors such as temperature and voltage variations, which can cause phase misalignment. Moreover, they lack calibration capabilities and digital control mechanisms, making it difficult to adapt to dynamic conditions or compensate for long-term drift. These limitations are particularly problematic in co-packaged photonic systems, where large distances between modulator segments introduce additional challenges for skew calibration.

In various embodiments, the subject technology provides systems and methods for clock generation and calibration that leverage a mixed-signal architecture, integrating both analog and digital components. The analog components enable high-resolution phase adjustments, while the digital control facilitates the implementation of calibration algorithms to compensate for variations in process, voltage, and temperature. For example, the calibration algorithms may include foreground calibration to establish initial phase alignment during startup, background calibration to adjust for long-term environmental drift, and skew calibration to synchronize clock signals across multiple segments. By combining analog adjustments with digital control, the subject technology ensures robust phase alignment, enhancing the performance and reliability of high-speed communication systems.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the subject technology is not intended to be limited to the embodiments presented but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C"

each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an apparatus, which includes a first delay line configured to receive an input clock signal and generate a first clock signal by providing a first delay to the input clock signal. The apparatus further comprises a second delay line configured to receive the input clock signal and generate a second clock signal by providing a second delay to the input clock signal. The apparatus further comprises a phase detector coupled to the first delay line and the second delay line, the phase detector being configured to determine a phase difference between the first clock signal and the second clock signal. The apparatus further comprises a comparator coupled to the phase detector, the comparator being configured to generate an output signal based on the phase difference. The apparatus further comprises a controller coupled to the comparator, the controller being configured to adjust the first delay or the second delay based on the output signal.

Implementations may include one or more of the following features. The apparatus further comprises a first digital-to-analog converter (DAC) coupled to the controller and the first delay line, the first DAC is configured to adjust the first delay based on a first control signal from the controller. The apparatus further comprises a second DAC coupled to the controller and the second delay line, the second DAC is configured to adjust the second delay based on a second control signal from the controller. The controller is configured to determine a most significant bit (MSB) of the second control signal by comparing the phase difference between the first clock signal and the second clock signal to a first threshold. The first threshold is associated with a phase difference of 90 degrees between the first clock signal and the second clock signal. The controller is configured to adjust the second delay based on the output signal at a predefined interval. The apparatus further comprises a first circuit configured to correct duty cycle distortion of the input clock signal. The controller is configured to adjust the first clock signal relative to a reference clock signal. The apparatus further comprises a memory coupled to the controller, the memory being configured to store a look-up table (LUT), the LUT comprising a first skew set point associated with a first temperature, and the first skew set point being configured to align the first clock signal with the reference clock signal at the first temperature. The apparatus further comprises a temperature sensor coupled to the controller, the temperature sensor being configured to provide temperature data to the controller for adjusting the first delay.

According to another embodiment, the subject technology provides an apparatus, which comprises a first delay line configured to receive an input clock signal and generate a first clock signal by providing a first delay to the input clock signal. The apparatus further comprises a second delay line configured to receive the input clock signal and generate a second clock signal by providing a second delay to the input clock signal. The apparatus further comprises a phase detector coupled to the first delay line and the second delay line, the phase detector being configured to determine a phase difference between the first clock signal and the second clock signal. The apparatus further comprises a comparator coupled to the phase detector, the comparator being configured to generate an output signal based on the phase difference. The apparatus further comprises a controller coupled to the comparator, the controller being configured to generate a first control signal and a second control signal based on the output signal, the first control signal being associated with the first delay, and the second control signal being associated with the second delay.

Implementations may include one or more of the following features. The apparatus further comprises a first digital-to-analog converter (DAC) coupled to the controller and the first delay line, the first DAC being configured to adjust the first delay based on the first control signal. The apparatus further comprises a second DAC coupled to the controller and the second delay line, the second DAC is configured to adjust the second delay based on the second control signal. The controller is configured to determine a most significant bit (MSB) of the second control signal by comparing the phase difference between the first clock signal and the second clock signal to a first threshold. The controller is configured to adjust the second delay based on the output signal at a predefined interval.

According to yet another embodiment, the subject technology provides an apparatus, which comprises a first delay line configured to receive an input clock signal and generate a first clock signal by providing a first delay to the input clock signal. The apparatus further comprises a second delay line configured to receive the input clock signal and generate a second clock signal by providing a second delay to the input clock signal. The apparatus further comprises a phase detector coupled to the first delay line and the second delay line, the phase detector being configured to determine a phase difference between the first clock signal and the second clock signal. The apparatus further comprises a comparator coupled to the phase detector, the comparator being configured to generate an output signal based on the phase difference. The apparatus further comprises a controller coupled to the comparator, the controller being configured to generate a first control signal based on the output signal, the first control signal being configured to adjust the first clock signal relative to a reference clock signal.

Implementations may include one or more of the following features. The apparatus further comprises a memory coupled to the controller, the memory being configured to store a look-up table (LUT), the LUT comprising a first skew set point associated with a first temperature, and the first skew set point being configured to align the first clock signal with the reference clock signal at the first temperature. The apparatus further comprises a temperature sensor coupled to the controller, the temperature sensor being configured to provide temperature data to the controller for adjusting the first delay. The apparatus further comprises a first digital-to-analog converter (DAC) coupled to the controller and the first delay line, the first DAC is configured to adjust the first delay based on the first control signal from the controller. The controller is configured to adjust the second delay based on the output signal at a predefined interval.

FIG. 1A is a simplified diagram illustrating a co-packaged optical system 100, according to embodiments of the subject technology. This diagram merely provides an example, which should not unduly limit the scope of the claims. One of ordinary skill in the art would recognize many variations, alternatives, and modifications.

As shown, system 100 includes photonics integrated circuit (PIC) 102 and electronic integrated circuit (EIC) 101, which may be integrated within the same package. PIC 102 may include one or more MZMs, which are optical devices configured to modulate light by converting electrical signals into optical signals. Depending on the implementation, the modulation may be performed using various modulation schemes, such as PAM4, non-return-to-zero (NRZ), quadrature amplitude modulation (QAM), and/or the like.

In some examples, the modulation in PIC 102 may be performed using segmented MZMs. For instance, PIC 102 may include one or more MZM segments, such as first MZM segment 103*a*, second MZM segment 103*b*, and third MZM segment 103*c*, and/or the like. Each MZM segment may be configured to modulate a portion of the incoming light based on electrical data provided by a corresponding driver circuit in EIC 101. In some embodiments, the parallel data signals from EIC 101 may be synchronized with clock signals to ensure accurate modulation across the MZM segments. The outputs of these MZM segments collectively form a modulated optical signal, which may be transmitted through optical waveguide 106 for further processing or transmission.

In various implementations, EIC 101 is configured to provide the electrical data and clock signals required to drive the MZM segments in PIC 102. For instance, EIC 101 may include clock source 105 configured to generate an input clock signal (e.g., clk0). The input clock signal may be distributed across the MZM segments through one or more clock generation circuits, which produce additional clock signals (e.g., clk1 and clk2) by introducing controlled delays (e.g., Δt) to the input clock signal (e.g., clk0). In some examples, EIC 101 also generates parallel electrical data signals (e.g., d0, d1, and d2) that correspond to the input data streams intended for modulation.

In some embodiments, EIC 101 further includes one or more driver circuits, such as first driver circuit 104*a*, second driver circuit 104*b*, third driver circuit 104*c*, and/or the like. Each driver circuit may be configured to receive a data signal (e.g., d0, d1, or d2) and a corresponding clock signal (e.g., clk0, clk1, or clk2). In various examples, the driver circuits process the data and clock signals to generate electrical modulation signals that drive the corresponding MZM segments in PIC 102. For instance, first driver circuit 104*a* receives data signal d0 and clock signal clk0 to generate an electrical modulation signal for first MZM segment 103*a*. Similarly, second driver circuit 104*b* drives second MZM segment 103*b* with data signal d1 and clock signal clk1, and third driver circuit 104*c* drives third MZM segment 103*c* with data signal d2 and clock signal clk2.

In various implementations, system 100 may account for the propagation delay introduced by optical waveguide 106 in PIC 102 and the electrical components in EIC 101. The propagation delay between adjacent MZM segments in the PIC (e.g., denoted as Δt) may be determined by the physical spacing of the MZM segments in PIC 102, which corresponds to the propagation delay of the optical signal through optical waveguide 106. To ensure proper alignment, the propagation delay of the optical signals in PIC 102 must match the electrical propagation delay within EIC 101. In some embodiments, the electrical domain propagation delay may be controlled by using matched transmission lines to distribute the input clock signal across the MZM segments. However, variations in the optical propagation due to process variations, circuit delays, or environmental factors (e.g., aging or temperature changes) may introduce skew between the MZM segments.

To address these challenges, calibration mechanisms may be employed to correct for any residual skew caused by mismatches between the optical and electrical propagation delays. These calibration mechanisms enable precise alignment of the clock signals and ensure accurate synchronization between the MZM segments, thereby maintaining the integrity of the modulated optical signal.

Figure 1B:
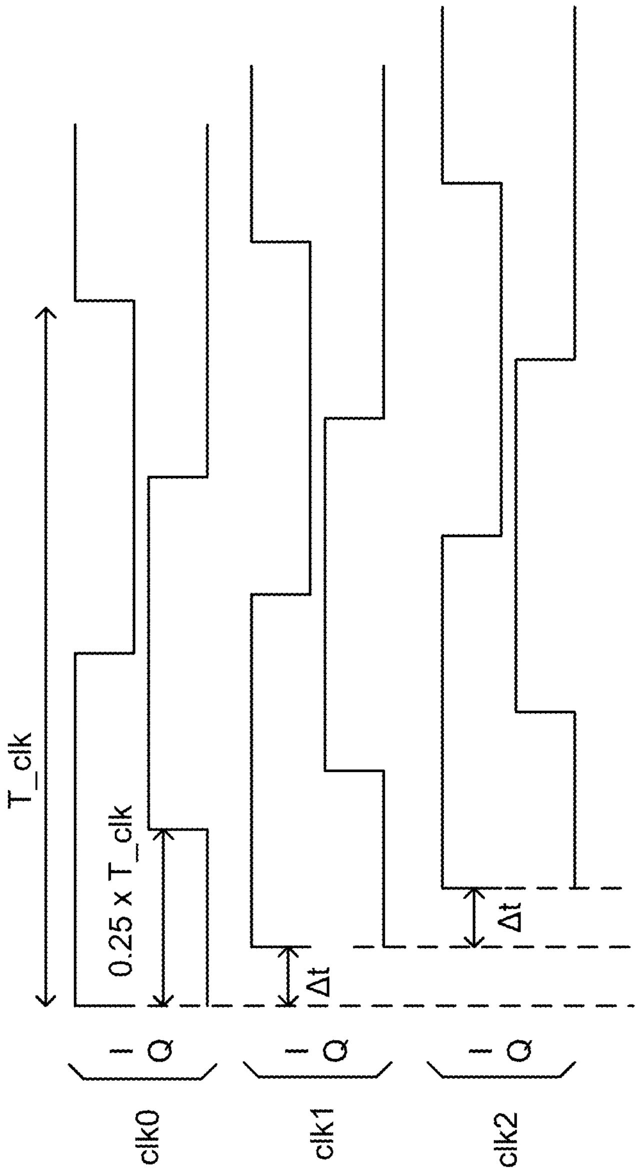
FIG. 1B is a simplified timing diagram illustrating clock signals driving mach-zehnder modulator (MZM) segments, according to embodiments of the subject technology.

FIG. 1B is a simplified timing diagram illustrating clock signals driving mach-zehnder modulator (MZM) segments, according to embodiments of the subject technology. This diagram merely provides an example, which should not unduly limit the scope of the claims. One of ordinary skill in the art would recognize many variations, alternatives, and modifications.

As shown, FIG. 1B illustrates clock signals clk0, clk1, and clk2, each of which is generated and distributed by EIC 101 to synchronize the operation of the respective MZM segments 103*a*, 103*b*, and 103*c* in PIC 102. Each clock signal includes an I component and a Q component. For example, the clock signals have a period denoted as T_clk. Within each clock period, the Q signal is delayed by 0.25×T_clk relative to the I signal, corresponding to the 90-degree phase shift required for quadrature modulation. It is to be appreciated that the clock signals clk1 and clk2 may be delayed versions of clk0, with each delay denoted by Δt. These delays are introduced to compensate for the physical separation between the MZM segments in PIC 102 and ensure proper synchronization of the parallel data streams (e.g., d0, d1, d2) with the clock signals. The Δt delay aligns the electrical domain clock signals with the optical propagation delay of the modulated light traveling through the optical waveguide in PIC 102.

The accurate generation and distribution of these clock signals are beneficial for maintaining the timing integrity of the modulated optical signal. Any deviations in the phase or timing relationships among the clock signals may lead to timing mismatches or skews among the MZM segments, degrading the quality of the PAM4 eye diagram. In some embodiments, various calibration mechanisms may be employed to adjust the Δt delays to correct for variations (e.g., temperature changes or process variations) in system 100.

Figure 2A:
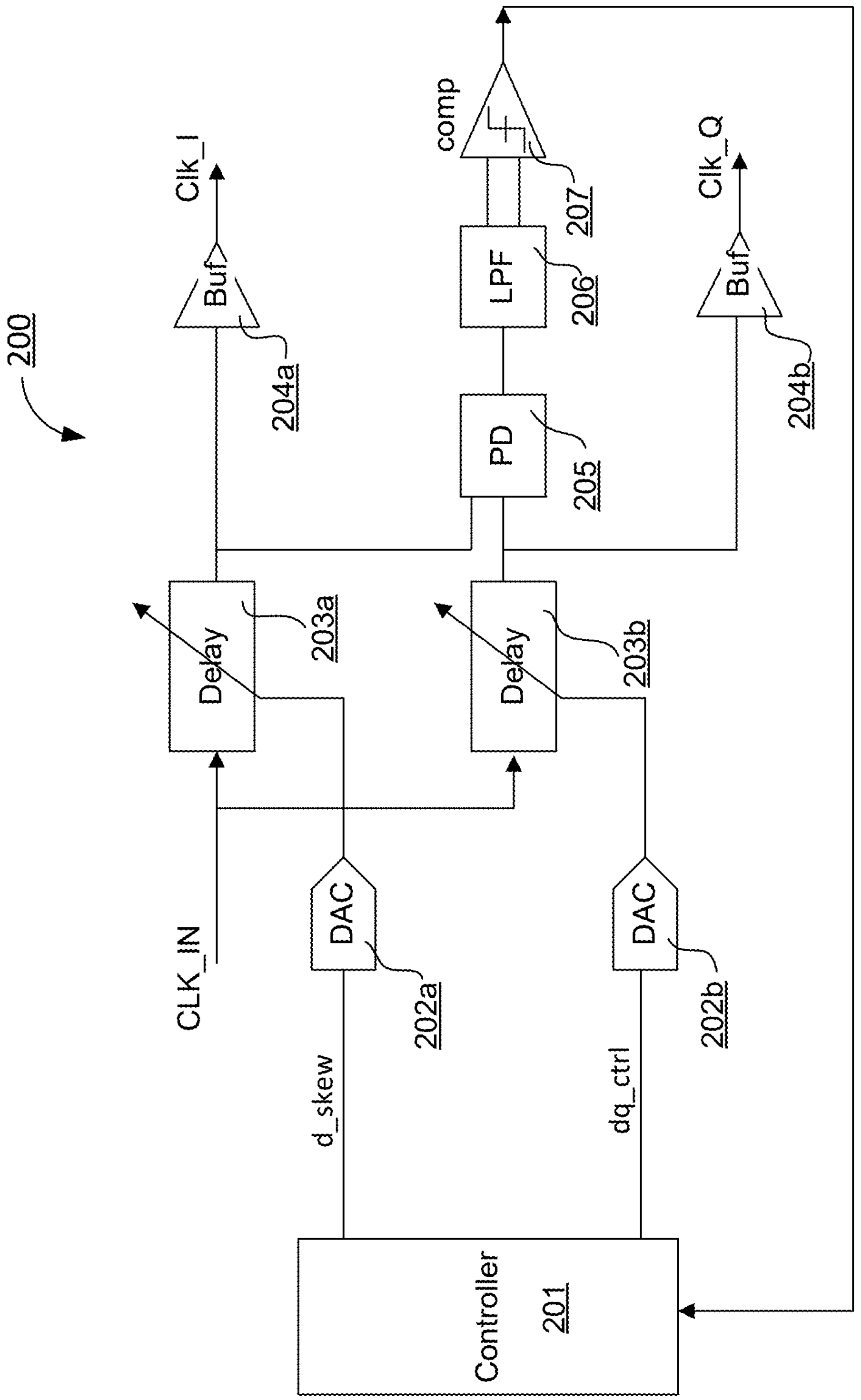
FIG. 2A is a simplified diagram illustrating a clock generation system, according to embodiments of the subject technology.

FIG. 2A is a simplified diagram illustrating a clock generation system 200, according to embodiments of the subject technology. This diagram merely provides an example, which should not unduly limit the scope of the claims. One of ordinary skill in the art would recognize many variations, alternatives, and modifications. In various implementations, system 200 is configured to generate and calibrate clock signals with precise phase relationships for use in high-speed communication systems.

In some embodiments, system 200 is configured to receive an input clock signal (e.g., CLK_IN) and generate multiple clock signals, which are phase-aligned with a specified phase difference. For instance, system 200 includes one or more delay lines configured to introduce controlled delays to the input clock signal. The term "delay line" may refer to a circuit or device designed to delay an input signal by a programmable or fixed amount of time. Delay lines may be implemented using analog components (e.g., resistor-capacitor networks), digital components (e.g., digital delay circuits), or a combination thereof, depending on the implementation.

As an example, system 200 includes first delay line 203*a* and second delay line 203*b*. First delay line 203*a* may be configured to receive the input clock signal (e.g., CLK_IN) and generate a first clock signal (e.g., Clk_I) by providing a first delay to the input clock signal. Second delay line 203*b* may be configured to receive the input clock signal and generate a second clock signal (e.g., Clk_Q) by providing a second delay to the input clock signal. For instance, the term "delay" may refer to a measurable time difference introduced to the signal's propagation, such as a controlled phase shift in the time domain. The delays introduced by the delay lines may be adjustable, programmable, or fixed, depending on the implementation.

In some embodiments, the first and second delays ensure that the first and second clock signals maintain a precise phase relationship, such as a 90-degree phase difference. For example, the first clock signal and the second clock signal may correspond to the I and Q components of a high-speed clock signal, respectively. A 90-degree phase difference between these clock signals is essential for certain applications (e.g., QAM or PAM4), where the I and Q components are used to encode data onto an optical carrier. Any deviation from the desired phase alignment may result in distortion of the modulated signal and increased bit error rates. It is important to maintain the required phase relationship to ensure reliable data encoding and to prevent performance degradation in high-speed communication systems.

In various examples, system 200 further includes phase detector 205, which may be coupled to first delay line 203*a* and second delay line 203*b*. For example, the term "phase detector" may refer to a circuit or device configured to measure the phase difference between two or more input signals. Examples of phase detectors may include, without limitation, XOR gates, phase comparators, analog mixers, digital phase comparison algorithms, and/or the like. Phase detector 205 may be configured to determine a phase difference between the first clock signal and the second clock signal. For instance, the term "phase difference" may refer to the temporal or angular offset between corresponding points in two or more periodic signals. Depending on the application, the phase difference may be measured in units of time (e.g., nanoseconds or picoseconds) or angle (e.g., degrees or radians). In some embodiments, phase detector 205 receives signals from the delay lines (e.g., first delay line 203*a* and second delay line 203*b*) and generates a phase error signal indicative of the phase relationship between the first and second clock signals.

In various implementations, system 200 further includes comparator 207 coupled to phase detector 205. For example, the term "comparator' may refer to a circuit or device configured to compare an input signal against a predefined threshold or reference value. Examples of comparators may include, without limitation, sign comparators, voltage comparators, digital comparators, differential comparators, and/or the like. For instance, comparator 207 is configured to receive the output of phase detector 205 and generate an output signal indicating whether the second clock signal is leading or lagging relative to the desired phase alignment (e.g., 90 degrees). In some cases, the output signal of comparator 207 may include a binary signal (e.g., 0 or 1). For example, if the phase error signal generated by phase detector 205 indicates a positive offset, meaning that the second clock signal is leading, comparator 207 generates a logic high signal (e.g., 1). Conversely, if the phase error signal indicates a negative offset, meaning that the second clock signal is lagging, comparator 207 generates a logic low signal (e.g., 0).

According to certain embodiments, system 200 further includes filter 206 coupled to phase detector 205 and comparator 207. Filter 206 may be configured to process the phase error signal generated by phase detector 205 to reduce noise and stabilize the signal before it is provided to comparator 207. For example, the term "filter" may refer to a circuit or device designed to selectively process specific frequency components of an input signal. Examples of filters may include, without limitation, low-pass filters, high-pass filters, band-pass filters, digital filters, and/or the like. In an example, filter 206 may include a low-pass filter, which is configured to remove transient fluctuations and noise from the phase error signal.

In some implementations, system 200 further includes controller 201, which may be coupled to comparator 207. For instance, the term "controller" may refer to a device designed to manage the operation of one or more components in a system. Examples of controllers may include, without limitation, finite state machines (FSMs), digital signal processors (DSPs), microcontrollers, programmable logic controllers, digital processors, application-specific integrated circuits (ASICs), field-programmable gate arrays (FPGAs), and/or the like. Depending on the application, controller 201 may be implemented as hardware, software, or a combination of both. In some aspects, a controller may include digital logic, processors, memory, or other elements to execute control algorithms or process input data.

In various embodiments, controller 201 is configured to process the output signal from comparator 207 and generate control signals to adjust the delays introduced by the delay lines (e.g., first delay line 203*a* and second delay line 203*b*). For instance, controller 201 evaluates the output signal from comparator 207, which indicates whether the second clock signal (e.g., Clk_Q) is leading or lagging relative to the first clock signal (e.g., Clk_I). Based on the evaluation, controller 201 generates a first control signal (e.g., d_skew) and/or a second control signal (e.g., dq_ctrl) to adjust the first delay and/or the second delay, respectively. For example, the term "control signal" may include any signal used to influence, adjust, or direct the behavior of a circuit, device, or system. Control signals may be digital or analog and may carry information about desired settings, adjustments, or operating modes. In some cases, the first and second control signals are used to fine-tune the phase alignment between the clock signals to achieve the desired phase relationship (e.g., a 90-degree phase difference).

In some implementations, system 200 further includes one or more digital-to-analog converters (DACs) coupled to controller 201. For example, first DAC 202*a* is coupled to controller 201 and first delay line 203*a*, and second DAC 202*b* is coupled to controller 201 and second delay line 203*b*. The term "digital-to-analog converter" may refer to a circuit or device configured to convert a digital input signal into a corresponding analog output signal. Examples of DACs may include, without limitation, ladder DACs, binary weighted DACs, sigma-delta DACs, and/or the like.

In certain embodiments, first DAC 202*a* is configured to adjust the first delay introduced by first delay line 203*a* based on the first control signal generated by controller 201. Second DAC 202*b* may be configured to adjust the second delay based on the second control signal generated by controller 201. The DACs operate as intermediaries between controller 201 and the analog delay lines. For instance, first DAC 202*a* is configured to receive the first control signal (e.g., d_skew) from controller 201 and convert it into an analog output signal to adjust the first delay applied to the input clock signal (e.g., CLK_IN), resulting in the generation of the first clock signal (e.g., Clk_I). Similarly, second DAC 202*b* is configured to receive the second control signal (e.g., dq_ctrl) from controller 201 and convert it into an analog output signal that adjusts the second delay applied by second delay line 203*b*, resulting in the generation of the second clock signal (e.g., Clk_Q). Depending on the implementation, the control signals may include single or multi-bit digital words (e.g., 10-bit, 12-bit, 16-bit, etc.). In some cases, controller 201 drives the d_skew and dq_ctrl digital words based on algorithms designed for foreground or background calibration of the clock phases or lane-skew calibration schemes.

Depending on the implementation, controller 201 may execute various calibration algorithms to ensure accurate clock generation and phase alignment. For instance, controller 302 may perform foreground calibration during the power-up stage to align the I/Q clock phases for each MZM segment. For instance, controller 201 may be configured to determine a most significant bit (MSB) of the second control signal by comparing the phase difference between the first clock signal and the second clock signal to a first threshold. For instance, the term "most significant bit" may refer to the bit position in a binary number that carries the highest value or represents the largest power of two. In some aspects, the MSB may be used to make coarse adjustments or determinations in digital systems. In some cases, the first threshold is associated with a phase difference of 90 degrees between the first clock signal and the second clock signal.

During normal operation, controller 201 may carry out background calibration to compensate for environmental variations over time. For instance, controller 201 is configured to adjust the second delay based on the output signal of comparator 207 at a predefined interval. Additionally, controller 201 may manage the calibration of MZM driver lane skew, ensuring that the timing and phase of the clock signals driving different MZM segments remain aligned, thereby preserving the quality of the modulated optical signal. For example, controller 201 is configured to adjust the first clock signal relative to a reference clock signal (e.g., an anchor point).

In some embodiments, system 200 may further include a memory (not shown) coupled to controller 201. The memory may be configured to store a look-up table (LUT), which includes temperature-dependent skew set points for calibration under varying conditions to compensate for environmental variations during system operation. The term "look-up table" may refer to a data structure or memory array used to map input values to pre-computed output values. For instance, the LUT includes a first skew set point associated with a first temperature. The term "skew set point" may refer to a predefined value or range of values that determine the required delay adjustment under specific operating conditions. As an example, the first skew set point may be configured to align the first clock signal with the reference clock signal at the first temperature. In some embodiments, controller 201 may receive real-time temperature readings from a temperature sensor and adjust the first delay based on the corresponding skew set point retrieved from the LUT.

It is to be understood that the use of a mixed-signal (e.g., digital and analog) architecture in system 200 allows for precise phase adjustments using the analog delay lines and DACs, while the digital controller enables real-time calibration and compensation for environmental variations. This combination ensures accurate clock generation, which is beneficial for maintaining signal integrity in high-speed communication systems.

In some examples, system 200 further includes first buffer 204*a* coupled to first delay line 203*a* and/or second buffer 204*b* coupled to second delay line 203*b*. Examples of buffers may include, without limitation, voltage buffers, current buffers, digital buffers, and/or the like. For example, the buffers may be configured to stabilize and/or amplify the clock signals (e.g., Clk_I and Clk_Q) before distributing them to downstream systems. The output clock signals may be used to drive modulators, serializers, or other high-speed components in various communication systems or signal-processing applications.

Figure 2B:
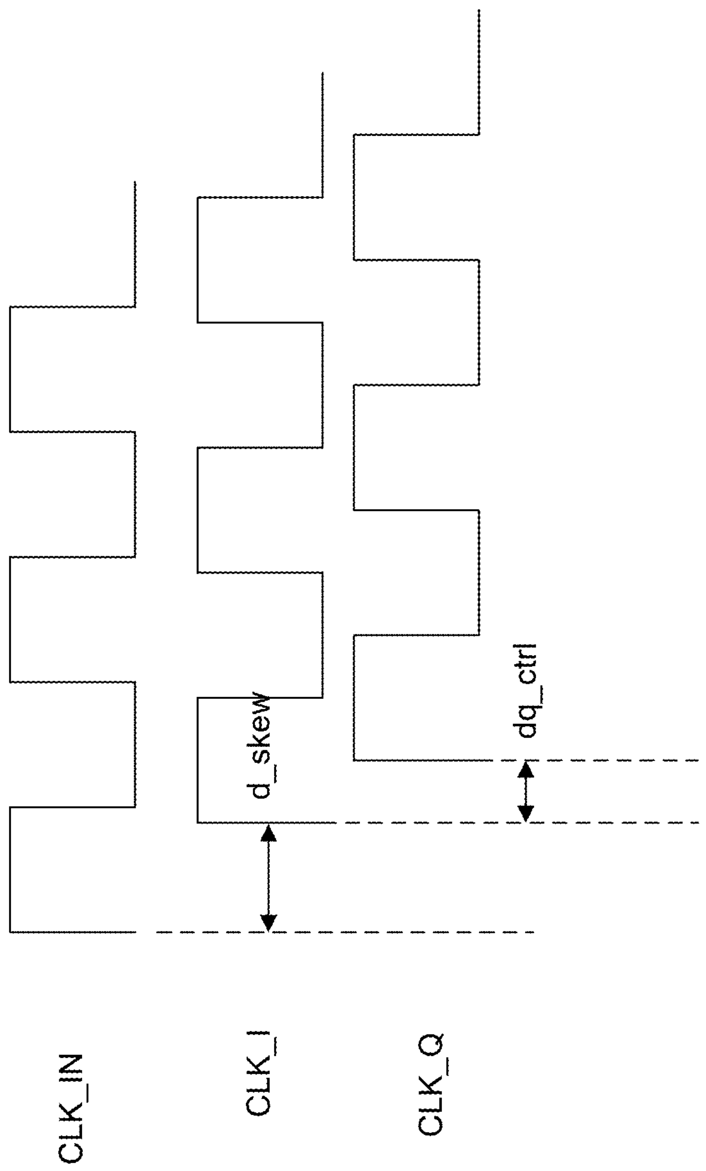
FIG. 2B is a simplified timing diagram illustrating the clock signals generated by a clock generation system, according to embodiments of the subject technology.

FIG. 2B is a simplified timing diagram illustrating the clock signals generated by a clock generation system (e.g., system 200 of FIG. 2A), according to embodiments of the subject technology. This diagram merely provides an example, which should not unduly limit the scope of the claims. One of ordinary skill in the art would recognize many variations, alternatives, and modifications.

In various implementations, system 200 receives an input clock signal CLK_IN, which serves as the reference clock for generating a first clock signal CLI_I and a second clock signal CLK_Q. For instance, the first clock signal CLI_I may be generated by introducing a first delay to the input clock signal CLK_IN (e.g., using first delay line 203*a*), and the second clock signal CLK_Q may be generated by introducing a second delay to the input clock signal CLK_IN (e.g., using second delay line 203*b*).

In some examples, the first delay may be adjusted based on a first control signal (e.g., d_skew) provided by controller 201 to first DAC 202*a*, which converts the digital control signal into an analog output to modulate the delay applied by first delay line 203*a*. Similarly, the second delay may be adjusted based on a second control signal (e.g., dq_ctrl) provided by controller 201 to second DAC 202*b*, which converts the digital control signal into an analog output to modulate the delay applied by second delay line 203*b*. The phase relationship between Clk_I and Clk_Q may be determined by the relative delays (e.g., the first and second delays) introduced by the delay lines. For example, the delays may be calibrated to maintain a 90-degree phase difference between Clk_I and Clk_Q.

Figure 3:
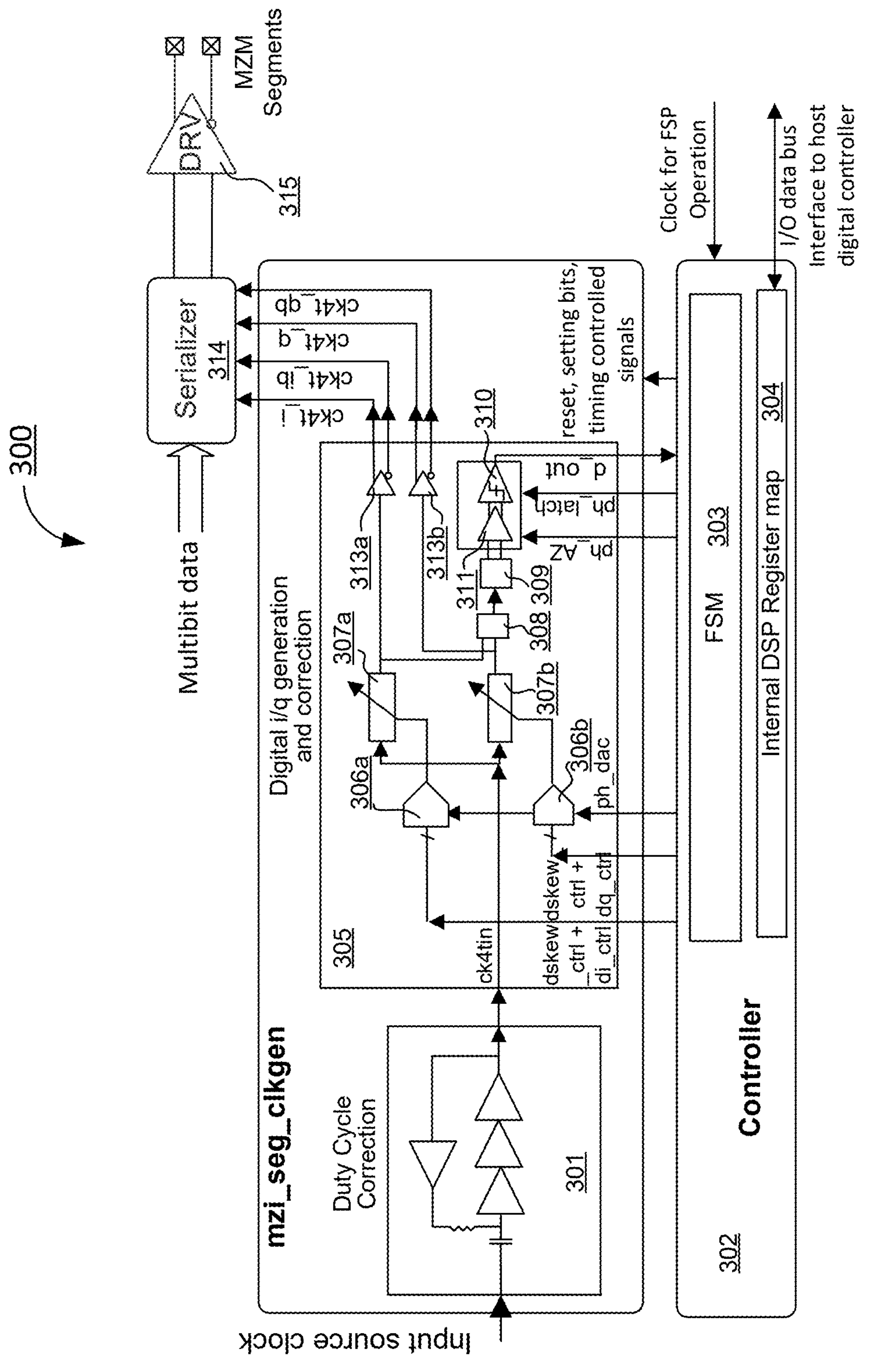
FIG. 3 is a simplified diagram illustrating a clock generation and calibration system, according to embodiments of the subject technology.

FIG. 3 is a simplified diagram illustrating a clock generation and calibration system 300, according to embodiments of the subject technology. This diagram merely provides an example, which should not unduly limit the scope of the claims. One of ordinary skill in the art would recognize many variations, alternatives, and modifications. In various implementations, system 300 is configured to generate and calibrate multi-phase clock signals for driving MZM segments with precise timing and phase relationships.

As shown, system 300 may operate on an input source clock, which serves as the reference clock for generating the output clock signals. In some examples, the input source clock may be processed by first circuit 301, which may be configured to correct duty cycle distortion of the input clock signal. The term "duty cycle distortion" may refer to any deviation from an ideal or desired duty cycle in a periodic signal. Correction of duty cycle distortion may involve adjusting the relative durations of high and low states in the signal. For instance, first circuit 301 may include a duty cycle correction circuit comprising logic gates and feedback elements that adjust the input clock signal to maintain a consistent duty cycle (e.g., 50%). The corrected clock signal (e.g., ck4tin) is then provided to clock generator 305 for further processing.

In various embodiments, clock generator 305 may perform various clock generation and calibration operations to generate multi-phase clock signals (e.g., in-phase and quadrature-phase clock signals). In some examples, similar to system 200 of FIG. 2A, clock generator 305 may include at least one of first DAC 306*a*, second DAC 306*b*, first delay line 307*a*, second delay line 307*b*, phase detector 308, filter 309, comparator 310, first buffer 313*a*, second buffer 313*b*, and/or the like. These components work together to introduce controlled delays to the input clock signal, enabling precise phase adjustments and ensuring the required phase relationships between the output clock signals (e.g., ck4*t*_i, ck4*t*_q, and their inverted counterparts ck4*t*_ib, ck4*t*_qb).

According to some embodiments, system 300 further includes controller 302 coupled to clock generator 305. Controller 302 may be configured to manage and coordinate the operation of clock generator 305 to achieve accurate clock generation and calibration. For instance, controller 302 may employ digital control logic and calibration algorithms to adjust the delays applied to the input clock signal. In some cases, controller 302 may be implemented as a digital signal processor integrated with the rest of the circuitry, or as a standalone microcontroller or state machine, depending on the application.

In some implementations, controller 302 includes finite state machine (FSM) 303 and register map 304. For example, FSM 303 may execute the algorithms required for clock generation and calibration by managing the timing, sequencing, and control signals sent to various components of clock generator 305. In some cases, FSM 303 may receive an input clock signal (e.g., a low-speed DSP clock) for finite state processing (FSP) operation. Register map 304 provides an input/output data bus interface that allows an external controller to interact with the system. For instance, the external controller can write data to configure parameters such as the initial delay settings for the DACs, enable or disable specific calibration modes, or adjust timing parameters for FSM 303. In some cases, register map 304 also allows the external controller to read back internal states and values from the system operation.

In various examples, controller 302 may generate control signals to adjust the delays introduced by first delay line 307*a* and second delay line 307*b*. For instance, controller 302 may transmit a first control signal (e.g., dskew_ctrl+di_ctrl) to first DAC 306*a* to adjust the first delay introduced by first delay line 307*a*. Controller 302 may also transmit a second control signal (e.g., dskew_ctrl+dq_ctrl) to second DAC 306*b* to adjust the second delay introduced by second delay line 307*b*. In some cases, these control signals may be generated based on the output signal of comparator 310 (e.g., d_out), which reflects the detected phase error between the first and second clock signals.

In addition, controller 302 may generate other signals necessary for the operation of clock generator 305. For instance, controller 302 may output reset signals to initialize or reset components of clock generator 305, as well as setting bits and timing-controlled signals to configure and coordinate the various operations within clock generator 305. In some implementations, controller 302 may generate the ph_dac signal, which is transmitted to the DACs (e.g., first DAC 306*a* and/or second DAC 306*b*) to latch the digital control words (e.g., dskew_ctrl, dq_ctrl) at specific intervals, enabling precise adjustments to the delays introduced by the delay lines.

In some embodiments, comparator 310 employs an auto-zeroing (AZ) mechanism to mitigate input-referred offsets that could otherwise result in phase detection errors. For instance, comparator 310 may further include stage 311 preceding the main comparator circuit. Stage 311 may be controlled by a signal transmitted from controller 302 (e.g., ph_AZ), which triggers the auto-zeroing process. During operation, the ph_AZ signal drives stage 311 to measure and cancel out the comparator's offset during each sign detection phase. The corrected offset value may be retained in a sample-and-hold (S&H) stage within stage 311, ensuring consistent accuracy during subsequent phase detection cycles. For instance, the S&H stage may be controlled by another signal generated by controller 302 (e.g., ph_latch). The ph_latch signal enables comparator 310 to sample the phase error signal at specific intervals and hold the sampled value for further processing.

In various embodiments, the output clock signals (e.g., ck4*t*_i, ck4*t*_q, ck4*t*_ib, ck4*t*_qb) may be provided to serializer 314, which is configured to convert parallel data streams into serialized data for transmission. For instance, serializer 314 may utilize the multi-phase clock signals (e.g., ck4*t*_i, ck4*t*_q, etc.) as timing references to combine data from multiple input channels into a single high-speed output stream. In some examples, the serialized data is then transmitted to driver 315, which is configured to amplify the signal for driving the MZM segments. For example, driver 315 generates electrical modulation signals corresponding to the serialized data, enabling the MZM segments to encode the data onto an optical carrier.

Figure 4A:
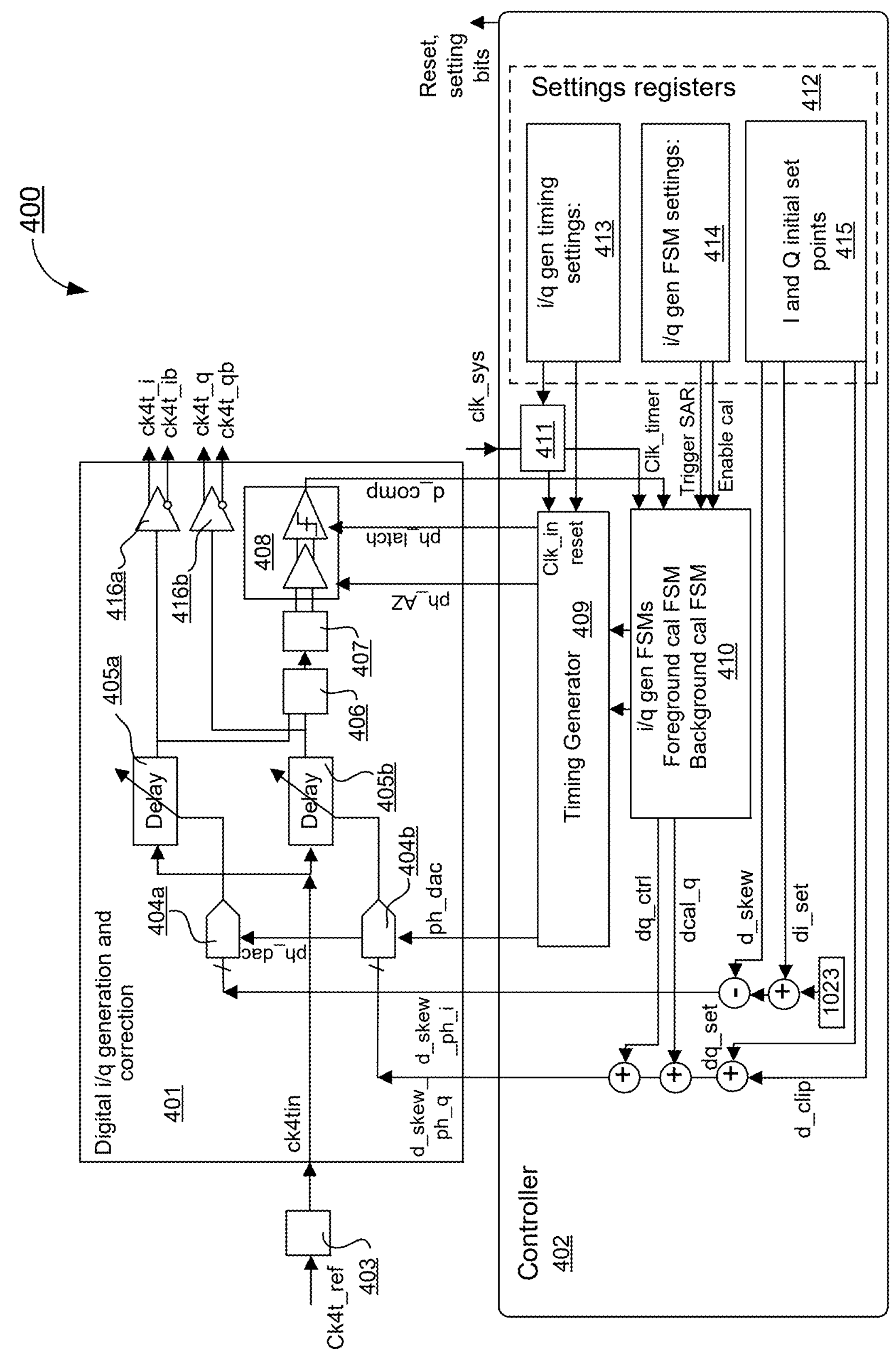
FIG. 4A is a simplified diagram illustrating a clock generation and calibration system, according to embodiments of the subject technology.

FIG. 4A is a simplified diagram illustrating a clock generation and calibration system 400, according to embodiments of the subject technology. This diagram merely provides an example, which should not unduly limit the scope of the claims. One of ordinary skill in the art would recognize many variations, alternatives, and modifications.

Similar to system 300 of FIG. 3, system 400 operates on an external reference clock signal (e.g., Ck4*t*_ref), which serves as the input clock for the clock generation system. In some cases, the reference clock signal may originate from an external source (e.g., a phase-locked loop) and is first processed by circuit 403. Circuit 403 may be configured to correct duty cycle distortion of the input clock signal (e.g., Ck4*t*_ref) and provide the corrected clock signal (e.g., ck4tin) to clock generator 401 for further processing.

As shown, clock generator 401 may include at least one of first DAC 404*a*, second DAC 404*b*, first delay line 405*a*, second delay line 405*b*, phase detector 406, filter 407, comparator 408, first buffer 416*a*, second buffer 416*b*, and/or the like. These components work together to introduce controlled delays to the input clock signal and output multi-phase clock signals (e.g., ck4*t*_i, ck4*t*_q, ck4*t*_ib, ck4*t*_qb).

According to some embodiments, system 400 further includes controller 402 coupled to clock generator 401. Controller 402 may be configured to manage and coordinate the operation of clock generator 401 to achieve accurate clock generation and calibration. In some examples, controller 402 includes at least one of timing generator 409, FSM 410, register map 412, and/or the like. In some embodiments, controller 402 may be configured to generate one or more control signals to adjust the delays introduced by the delay lines within clock generator 401. For instance, controller 402 may transmit a first control signal (e.g., d_skew_ph_i) to first DAC 404*a* to adjust a first delay associated with the I-clock path. Controller 402 may further transmit a second control signal (e.g., d_skew_ph_q) to second DAC 404*b* to adjust a second delay associated with the Q-clock path.

In various implementations, controller 402 may receive a system clock signal (e.g., clk_sys) as an input. For instance, clk_sys may be derived from a low-frequency system clock (e.g., 100 MHz) and act as the primary timing signal governing the operation and sequencing of components within controller 402. In some examples, clk_sys is processed by divider 411, which divides its frequency by a programmable ratio to generate additional clock signals (e.g., Clk_in, Clk_timer) suitable for use by FSM 410 and timing generator 409. For instance, the divide ratio for clk_sys may be programmed through settings 413 in register map 412.

In various embodiments, timing generator 409 is configured to generate timing signals necessary for the operation of clock generator 401. For instance, timing generator 409 produces signals such as ph_AZ (e.g., auto-zeroing), ph_latch (e.g., sample-and-hold), and ph_dac (e.g., DAC clock) to synchronize the operations of the various components within clock generator 401.

In some examples, FSM 410 is configured to execute calibration algorithms to align and maintain the I/Q clock phases generated by clock generator 401. Depending on the application, FSM 410 may include at least one of I/Q generation FSM, foreground calibration FSM, background calibration FSM, and/or the like. For instance, the I/Q generation FSM is configured to manages the timing of digital signals driving the auto-zeroing (e.g., ph_AZ), sample-and-hold (e.g., ph_latch), and/or DAC clocks (e.g., ph_dac) within timing generator 409.

During system initialization, power-up, or upon user request, the foreground calibration FSM may be configured to execute a binary search algorithm to calibrate the phase of the Q-clock path. In some implementations, it adjusts the DAC control words driving the DACs (e.g., d_skew_ph_q, dq_set+dq_ctrl+dcal_q) by monitoring the comparator output signal (e.g., d_comp) and iteratively refining the DAC values until the desired 90-degree phase difference between the I and Q clocks is achieved. For instance, the dq_ctrl signal may be controlled by the binary search algorithm and the dq_set signal may be reserved for a factory calibration.

As an example, if a 10-bit DAC is employed, the binary search algorithm may operate over 10 iterations and divide the entire control range (e.g., 0 to 1023) into halves at each step to achieve 10-bit precision. At each iteration, the foreground calibration FSM updates the MSB of the DAC control word based on whether the comparator output indicates the Q-clock is leading or lagging relative to the desired phase. Once the desired phase difference (e.g., 90 degrees) is reached, the foreground calibration FSM freezes the DAC control signal (e.g., dq_ctrl) to lock the calibrated phase alignment unless re-triggered by a reset, power-up, or user command.

During normal operation, the background calibration FSM may be configured to perform background calibration to compensate for phase drifts caused by environmental variations, such as temperature changes, voltage fluctuations, or aging effects. In some implementations, the background calibration FSM operates at specified time intervals, which may be triggered by a programmable timer with the FSM. It monitors the comparator output signal (e.g., d_comp) to detect deviations in the phase alignment and adjusts the dcal_q portion of the DAC control word accordingly.

In various implementations, register map 412 provides an interface between controller 402 and external host systems for configuring and monitoring the system. For instance, register map 412 may store operational parameters, calibration settings, and system status data, which can be accessed or modified by an external host through a bidirectional data bus interface. In some examples, register map 412 may include programmable settings for a variety of system parameters, such as I/Q generation timing settings 413, I/Q generation FSM settings 414, I/Q initial set points 415, and/or the like.

As an example, I/Q generation timing settings 413 may store programmable parameters for configuring timing generator 409. These parameters may define the timing relationships among the input and output signals of timing generator 409 (e.g., ph_AZ, ph_latch, etc.). In some embodiments, I/Q generation FSM settings 414 may store configuration data for FSM 410, which controls the execution of calibration algorithms such as the binary search algorithm for foreground calibration and the background calibration algorithm. These settings may include, without limitation, enable/disable flags for specific FSM modes, parameters defining the binary search range, thresholds for detecting phase drift during background calibration, and/or the like. In various examples, I/Q initial set points 415 may store factory-calibrated values for the I-clock and Q-clock DACs, providing a baseline configuration for system operation.

Figure 4B:
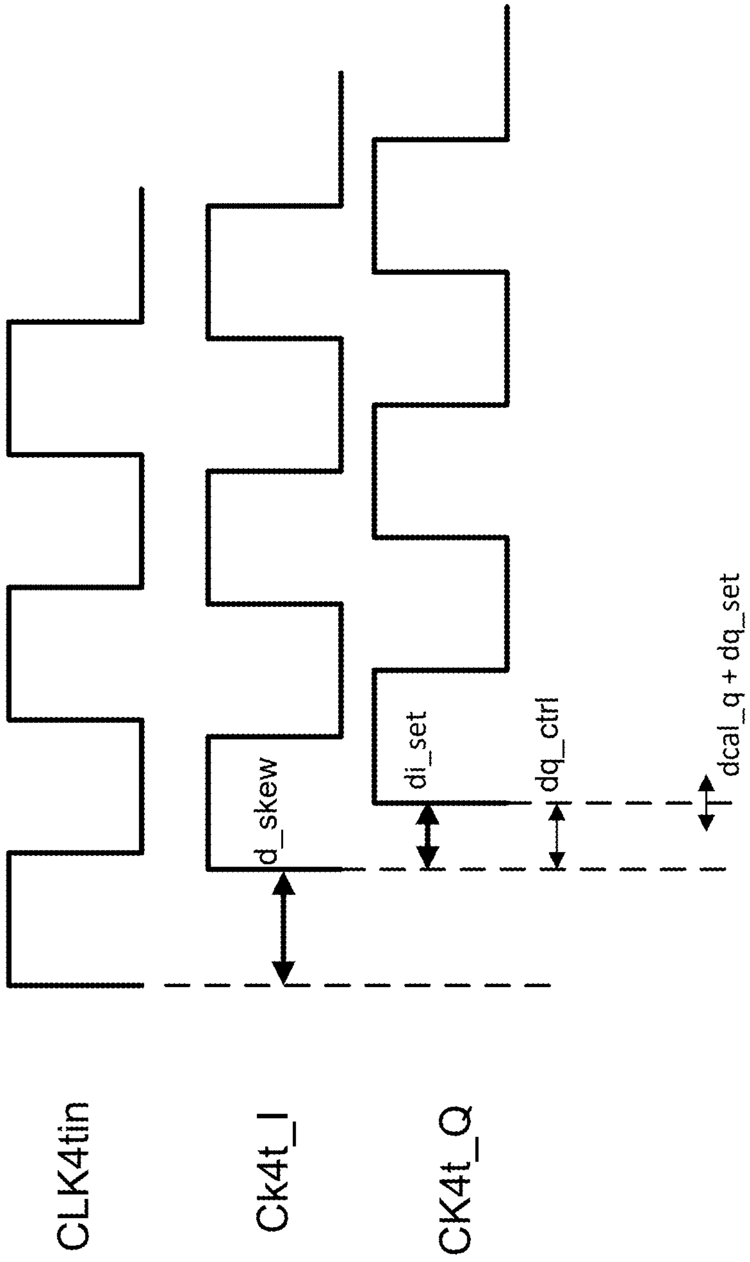
FIG. 4B is a simplified timing diagram illustrating the clock signals generated by a clock generation and calibration system, according to embodiments of the subject technology.

FIG. 4B is a simplified timing diagram illustrating the clock signals generated by a clock generation and calibration system (e.g., system 400 of FIG. 4A), according to embodiments of the subject technology. This diagram merely provides an example, which should not unduly limit the scope of the claims. One of ordinary skill in the art would recognize many variations, alternatives, and modifications.

FIG. 4B illustrates the input clock signal CLK4tin and the output signals CK4*t*_I and CK4*t*_Q. The input clock signal CLK4tin serves as the reference signal for generating the I/Q clock signals with precise phase relationships (e.g., 90-degree phase difference). In some embodiments, the output signal CK4*t*_I may represent the in-phase clock signal, which is generated by introducing a controlled delay (e.g., d_skew) relative to CLK4tin. For instance, this delay may be configured and adjusted by the DACs within clock generator 401, as controlled by the timing and calibration algorithms executed by controller 402.

In some examples, the output signal CK4*t*_Q may represent the quadrature-phase clock signal, which is generated by introducing a series of controlled delays relative to CK4*t*_I. For instance, these delays may include a factory-calibrated offset (e.g., di_set) for the initial phase alignment, a calibrated offset (e.g., dq_ctrl) introduced during foreground calibration, and/or a drift-compensation offset (e.g., dcal_q+dq_set) applied during background calibration.

Figure 5:
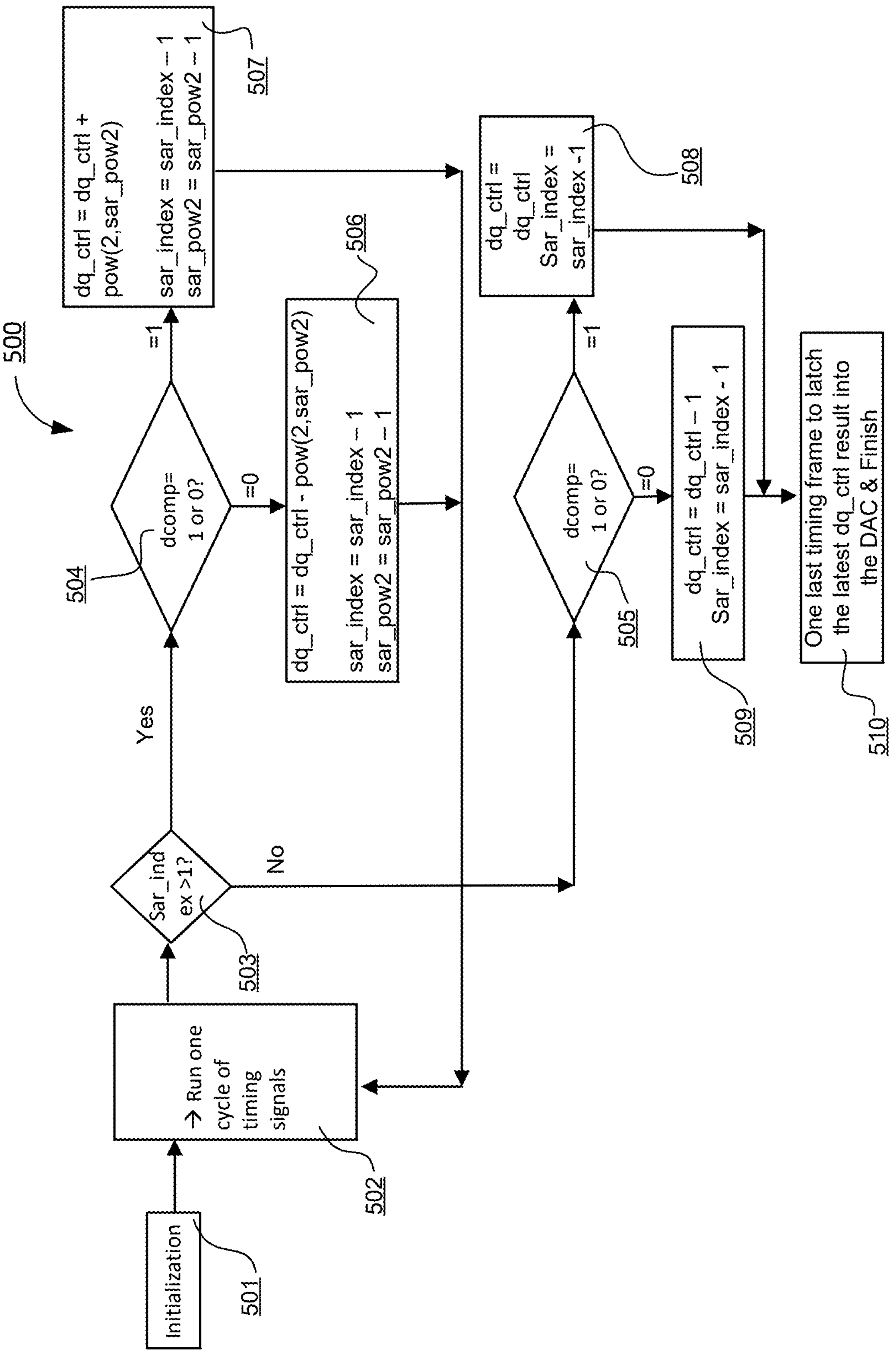
FIG. 5 is a simplified flow diagram illustrating a method for performing foreground calibration in a clock generation and calibration system, according to embodiments of the subject technology.

FIG. 5 is a simplified flow diagram illustrating a method 500 for performing foreground calibration in a clock generation and calibration system, according to embodiments of the subject technology. This diagram merely provides an example, which should not unduly limit the scope of the claims. One of ordinary skill in the art would recognize many variations, alternatives, and modifications.

In various implementations, method 500 may implement a binary search algorithm to adjust the phase of the Q-clock path. In step 501, the calibration process begins with the initialization of system parameters. For example, the value d_clip is loaded from the register map to be applied as a lower clipping level for the DAC. The DAC initial value (e.g., d_DAC_q) is set to dq_ctrl+dcal_q+dq_set+d_clip, where d_clip is an offset added to the DAC code from the lower end of the range to ensure that the DAC output remains within a valid operating range. The binary search parameters, such as the search index (e.g., sar_index) and the corresponding power of 2 value (e.g., sar_pow2), may be initialized to their maximum values (e.g., sar_index=10 and sar_pow2=8 for a 10-bit DAC).

In step 502, the controller executes one cycle of timing signals (e.g., ph_AZ, ph_latch, and/or ph_DAC) generated by the timing generator. During this step, the DAC control word (e.g., dq_ctrl) may be programmed into the DAC on the rising edge of the ph_DAC signal.

In decision step 503, the controller evaluates whether the binary search index (e.g., sar_index) is greater than 1. If the search index is greater than 1, the system enters the iterative search loop (e.g., steps 504 to 507) to refine the DAC control codes. Otherwise, method 500 proceeds to decision step 505 for final adjustments.

Within the binary search loop, in decision step 504, the comparator output signal (e.g., d_comp) is analyzed to determine whether the Q-clock phase is leading or lagging relative to the desired phase alignment. If d_comp=1, the system increments the DAC control word in step 507. For instance, the updated value is calculated as dq_ctrl=dq_ctrl+pow(2,sar_pow), and the search index (e.g., sar_index) and power of 2 value (e.g., sar_pow2) are decremented by one to refine the resolution. Method 500 then loops back to step 502. If d_comp=0 at decision step 504, the system decrements the DAC control word in step 506. For example, the updated value is calculated as dq_ctrl=dq_ctrl−pow(2, sar_pow2). The search index (e.g., sar_index) and power of 2 value (e.g., sar_pow2) are decremented by one, and the loop continues until sar_index=1.

When the search index reaches one, the system proceeds to decision step 505, where the comparator output (e.g., d_comp) is again evaluated for a final refinement. If d_comp=1, the DAC control word remains unchanged in step 508. If d_comp=0, the DAC control word is decremented by one in step 509 for final refinement.

In step 510, a final timing cycle is executed to latch the calibrated DAC control word into the DAC. This locks the Q-clock phase at the desired 90-degree alignment relative to the I-clock phase. The calibrated value remains stable unless the calibration process is re-triggered by a reset, power-up, or user command.

Figure 6A:
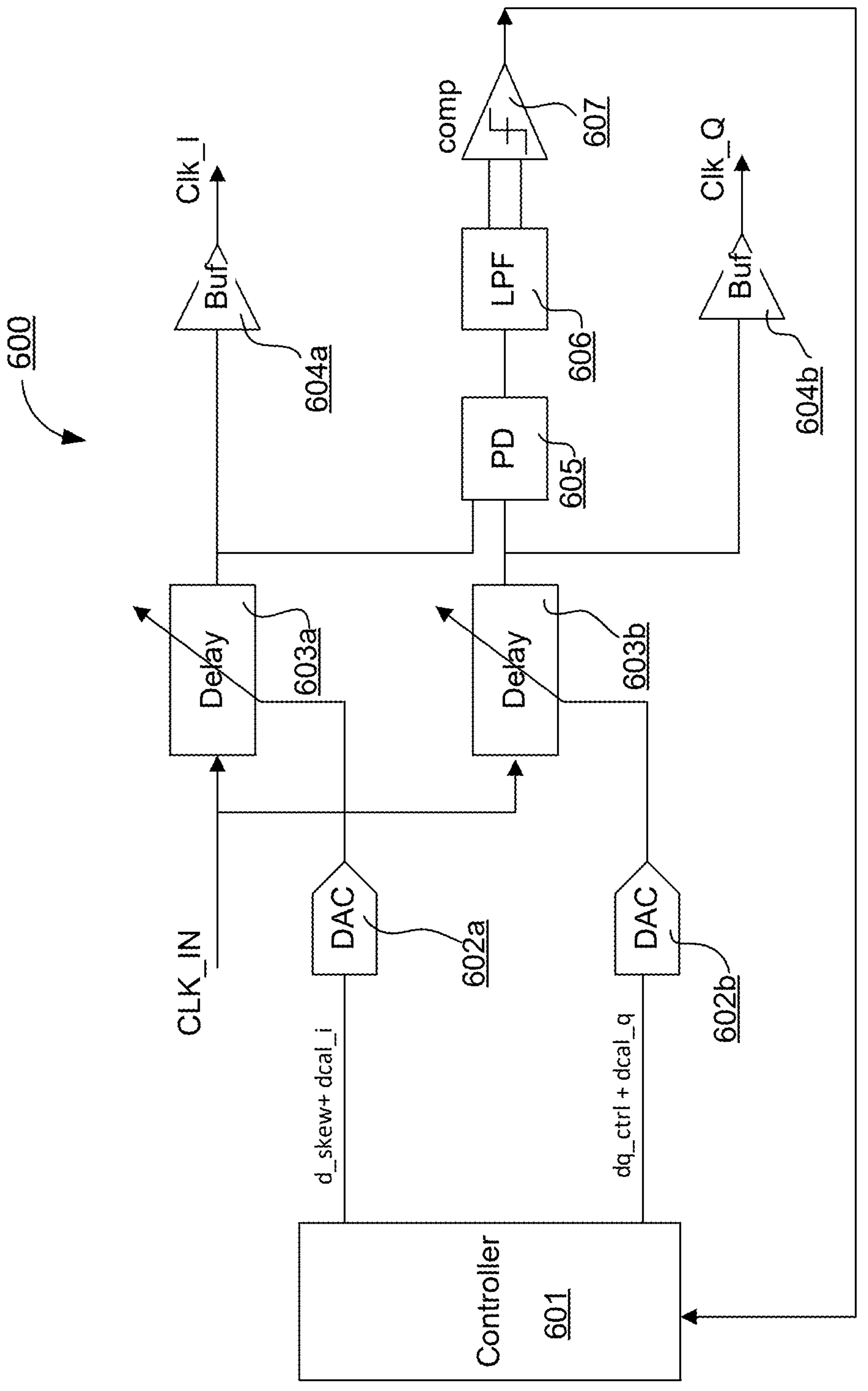
FIG. 6A is a simplified diagram illustrating a clock generation and calibration system, according to embodiments of the subject technology.

FIG. 6A is a simplified diagram illustrating a clock generation and calibration system 600, according to embodiments of the subject technology. This diagram merely provides an example, which should not unduly limit the scope of the claims. One of ordinary skill in the art would recognize many variations, alternatives, and modifications. In various embodiments, similar to system 200 of FIG. 2A, system 600 includes at least one of controller 601, first DAC 602*a*, second DAC 602*b*, first delay line 603*a*, second delay line 603*b*, phase detector 605, filter 606, comparator 607, first buffer 604*a*, second buffer 604*b*, and/or the like. In various implementations, system 600 may perform background calibration during normal operation to maintain phase alignment between the I and Q clock signals (e.g., Clk_I and Clk_Q) and compensate for phase drifts caused by environmental factors such as temperature changes, voltage fluctuations, or component aging.

In some embodiments, the background calibration process is achieved through the generation and application of control signals by controller 601. For example, a first control signal provided to first DAC 602*a* may be represented as d_skew+dcal_i, where d_skew is the factory-calibrated lane skew value, and dcal_i is a fixed or factory-set offset for the I-clock path. Similarly, a second control signal provided to second DAC 602*b* may be represented as dq_ctrl+dcal_q, where dq_ctrl is the frozen DAC code set during the foreground SAR calibration, and dcal_q is the correction term that compensates for phase drift during background calibration.

Figure 6B:
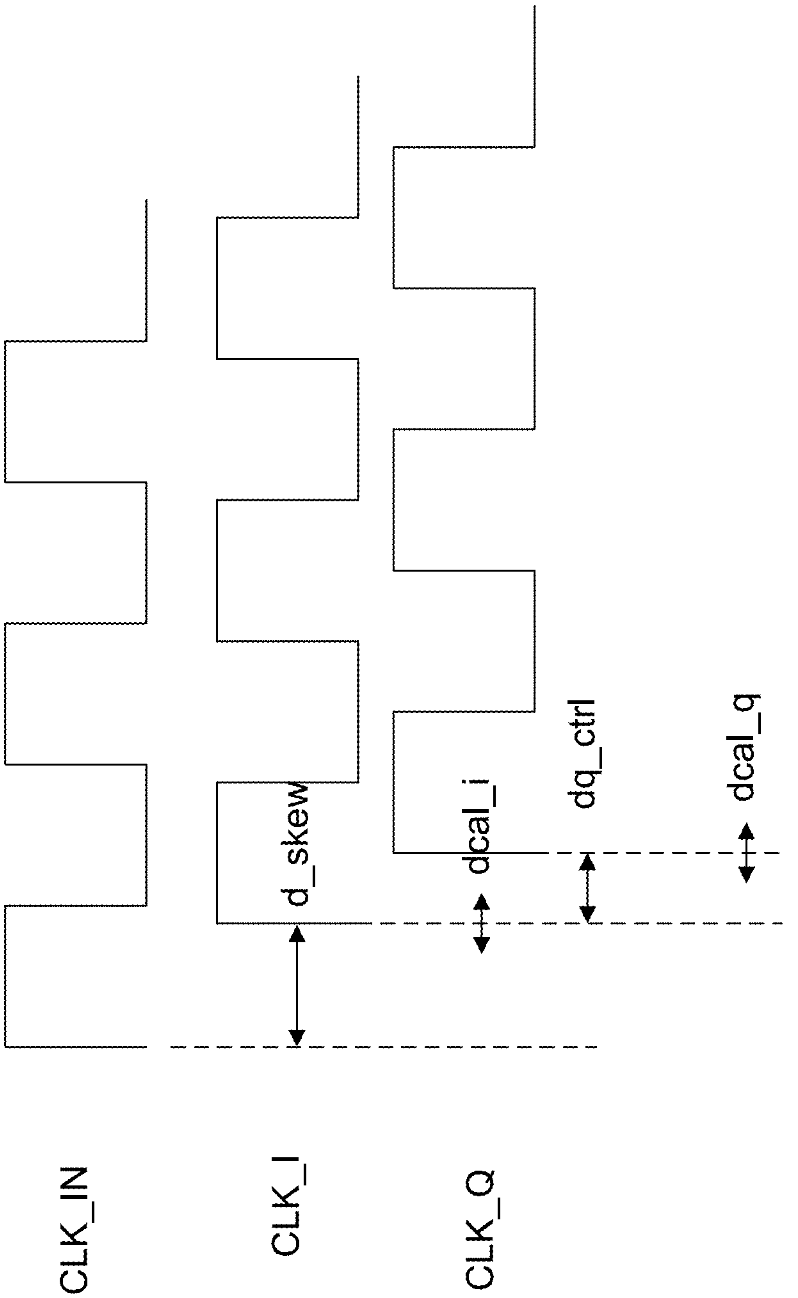
FIG. 6B is a simplified timing diagram illustrating the clock signals generated by a clock generation and calibration system, according to embodiments of the subject technology.

FIG. 6B is a simplified timing diagram illustrating the clock signals generated by a clock generation and calibration system, according to embodiments of the subject technology. This diagram merely provides an example, which should not unduly limit the scope of the claims. One of ordinary skill in the art would recognize many variations, alternatives, and modifications.

FIG. 6B illustrates the input clock signal (e.g., CLK_IN) and the output signals (e.g., CLK_I and CLK_Q). The input clock signal (e.g., CLK_IN) serves as the reference signal for generating the I/Q clock signals with precise phase relationships (e.g., 90-degree phase difference). In some embodiments, the output signal CLK_I may represent the in-phase clock signal, which is generated by introducing a controlled delay (e.g., d_skew) relative to CLK_IN. This delay may be configured and adjusted by first DAC (e.g., 602*a* in FIG. 6A) based on the first control signal d_skew+dcal_i, where d_skew represents the factory-calibrated lane skew value and dcal_i provides a static or factory-defined offset for the I-clock path.

In some examples, the output signal CLK_Q may represent the quadrature-phase clock signal, which is generated by introducing one or more controlled delays relative to CLK_I. These delays may include components such as a foreground-calibrated offset (e.g., dq_ctrl), which is configured during the binary search algorithm, and a background calibration adjustment (e.g., dcal_q), which compensates for phase drift caused by slow-varying factors such as temperature changes or aging. The sum of these offsets ensures that the Q-clock path achieves and maintains the desired 90-degree phase relationship with the I-clock path.

Figure 6C:
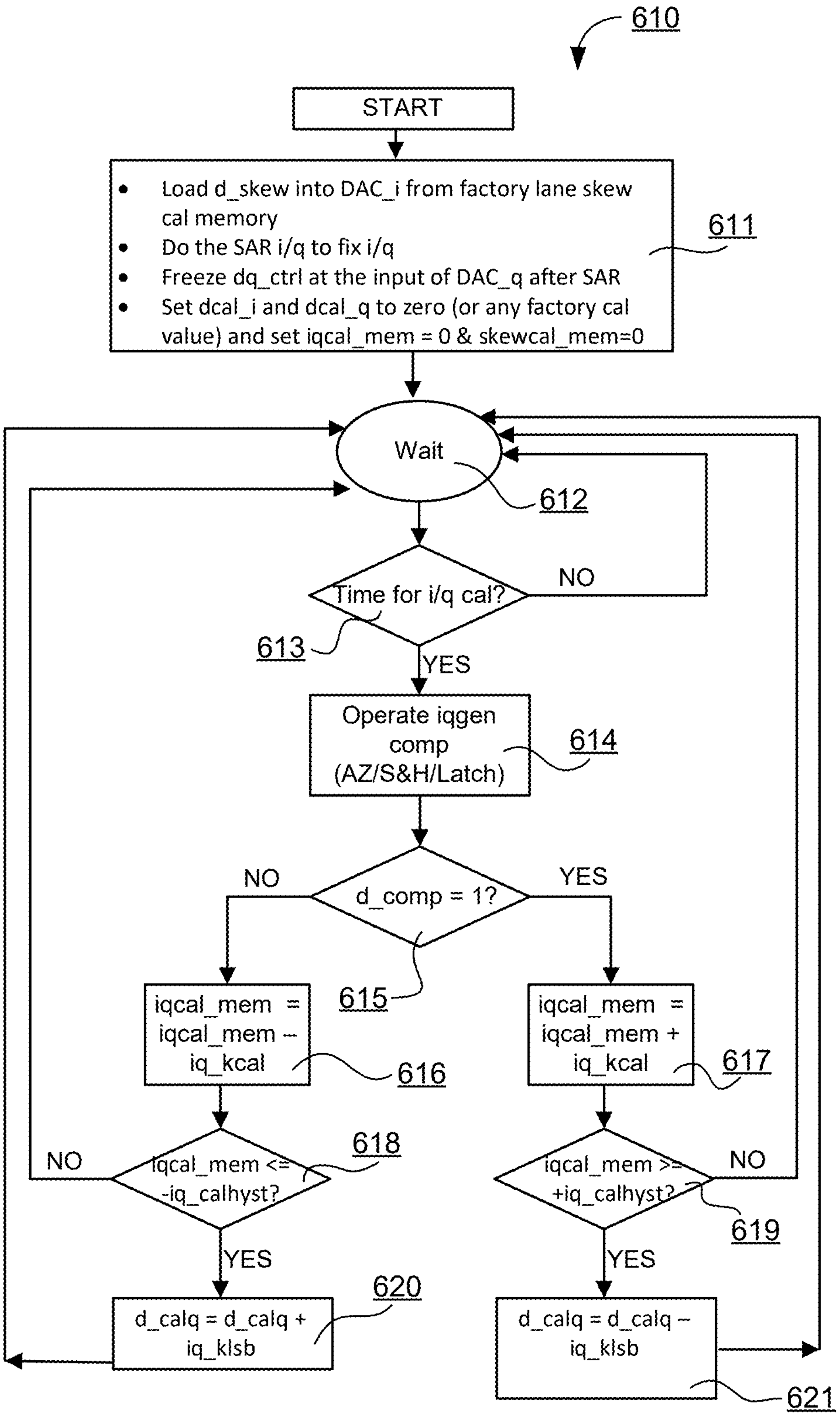
FIG. 6C is a simplified flow diagram illustrating a method for performing background calibration in a clock generation and calibration system, according to embodiments of the subject technology.

FIG. 6C is a simplified flow diagram illustrating a method 610 for performing background calibration in a clock generation and calibration system, according to embodiments of the subject technology. This diagram merely provides an example, which should not unduly limit the scope of the claims. One of ordinary skill in the art would recognize many variations, alternatives, and modifications.

In step 611, method 610 begins with the initialization of system parameters. For example, the control signal for the I-clock path (e.g., d_skew)—which may be retrieved from memory or derived from factory calibration—is loaded into the first DAC. The control signal for the Q-clock path (e.g., dq_ctrl)—which may be determined during a foreground calibration phase—is loaded into the second DAC. Background calibration offsets (e.g., dcal_i and dcal_q) may be initialized to zero or to predefined factory-calibrated values. Additionally, memory values associated with background calibration (e.g., iqcal_mem and skewcal_mem) may be set to zero.

After initialization, the system enters a wait state at step 612, where it remains idle until the background calibration timer triggers the process at step 613. Depending on the application, the background calibration may be performed at predetermined intervals, triggered by sudden changes in environmental conditions, or initiated by a user command.

In step 614, the background calibration process begins by operating the I/Q generation comparator (e.g., comparator 607 of FIG. 6A), which performs auto-zeroing, sampling and holding, and/or latching operations to detect the phase drift. The comparator output signal (e.g., d_comp) is then evaluated in step 615 to determine whether a positive or negative phase drift has occurred.

In step 615, if the comparator output is 0 (e.g., indicating a negative phase drift), method 610 proceeds to step 616. In step 616, the iqcal_mem value is decremented by a predefined step size (e.g., iq_kcal). In step 618, the updated iqcal_mem value is compared against a hysteresis threshold (e.g., −iq_calhyst). If iqcal_mem remains within the hysteresis range, the system returns to the wait state at step 612, as no significant phase drift has occurred. However, if iqcal_mem exceeds the hysteresis threshold, method 610 then advances to step 620, where the background calibration offset (e.g., dcal_q) is incremented by a programmable step size (e.g., iq_klsb). This adjustment compensates for the detected phase drift, and the system then returns to the wait state at step 612.

If the comparator output at step 615 is (e.g., indicating a positive phase drift), method 610 proceeds to step 617. At step 617, the iqcal_mem value is incremented by a predefined step size (e.g., iq_kcal). The method then advances to step 619, where iqcal_mem is compared against a hysteresis threshold (e.g., +iq_calhyst). If iqcal_mem remains within the hysteresis range, the system returns to the wait state at step 612. If iqcal_mem exceeds the hysteresis threshold, the method advances to step 621, where the background calibration offset (e.g., dcal_q) is decremented by a programmable step size (e.g., iq_klsb). The system then returns to the wait state at step 612.

The iterative background calibration process ensures that the clock generation system continuously compensates for slow-varying effects such as temperature changes, voltage fluctuations, or component aging. By periodically applying corrections based on the comparator output, the background calibration process enables the system to maintain precise clock phase alignment over extended periods without disrupting normal operation.

Figure 7:
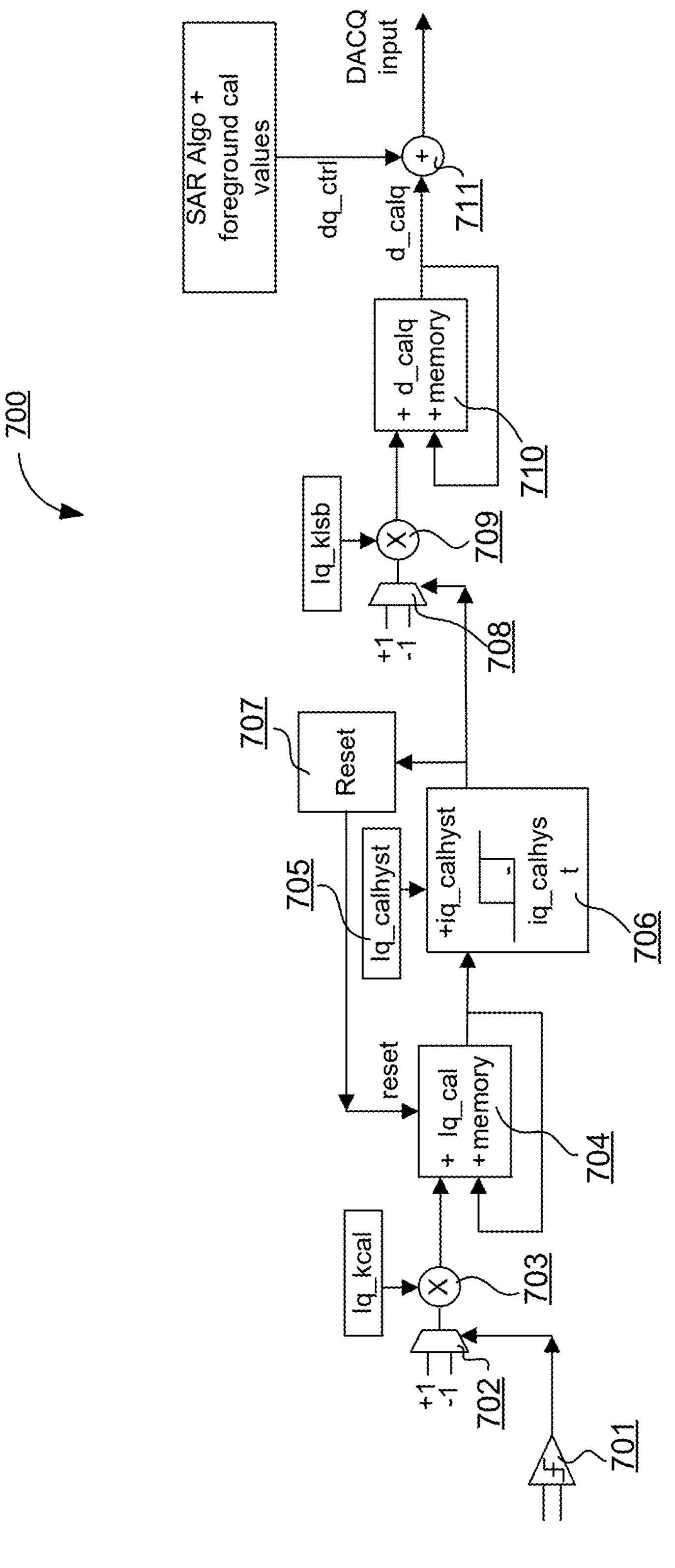
FIG. 7 is a simplified diagram illustrating a background calibration process in a clock generation and calibration system, according to embodiments of the subject technology.

FIG. 7 is a simplified diagram illustrating a background calibration process in a clock generation and calibration system 700, according to embodiments of the subject technology. This diagram merely provides an example, which should not unduly limit the scope of the claims. One of ordinary skill in the art would recognize many variations, alternatives, and modifications.

In various embodiments, system 700 includes comparator 701, which is configured to generate a binary signal indicating whether the Q-clock phase leads or lags relative to the desired phase alignment. The comparator output is passed to multiplexer 702, which determines the direction of correction based on the comparator output. The output of the multiplexer is then multiplied by a programmable gain factor (e.g., iq_kcal) in multiplier 703.

In some implementations, the correction signal is accumulated in integrator 704, which tracks the cumulative phase error over time. The output of integrator 704 is compared against predefined hysteresis thresholds 705 (e.g., ±iq_calhyst) in hysteresis comparator 706. If the drift remains within the hysteresis range, no adjustment is applied to the calibration offset, and the system remains in its current state. This ensures that small fluctuations in phase do not trigger unnecessary corrections, thereby improving the stability of the background calibration loop.

When the integrator output exceeds the hysteresis thresholds, it may trigger a reset signal 705 to resume accumulation from a neutral state. Upon exceeding the hysteresis thresholds, the calibration correction is further processed through multiplexer 708 and multiplier 709, which apply a programmable step size (e.g., iq_klsb) to increment or decrement the background calibration offset (e.g., dcal_q). In some examples, the updated offset is stored in memory 710 and subsequently combined with the foreground calibration value (e.g., dq_ctrl) at adder 711 to generate the final DAC input signal for the Q-clock path.

Figure 8A:
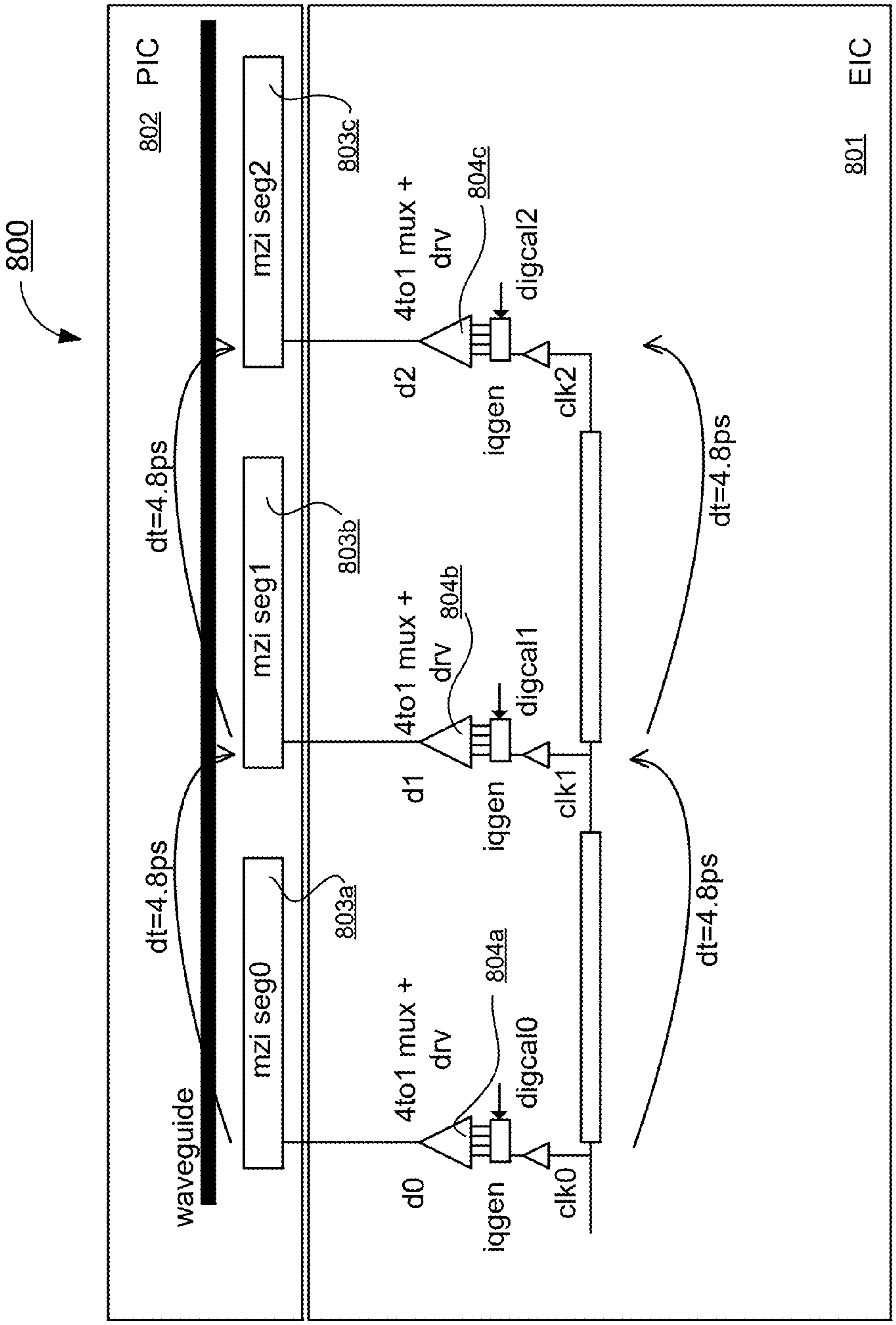
FIG. 8A is a simplified diagram illustrating a co-packaged optical system, according to embodiments of the subject technology.

FIG. 8A is a simplified diagram illustrating a co-packaged optical system 800, according to embodiments of the subject technology. This diagram merely provides an example, which should not unduly limit the scope of the claims. One of ordinary skill in the art would recognize many variations, alternatives, and modifications.

Similar to system 100 of FIG. 1A, system 800 includes EIC 801 and PIC 802. PIC 802 may include one or more MZM segments, such as first MZM segment 803*a*, second MZM segment 803*b*, third MZM segment 803*c*, and/or the like. Each MZM segment may be configured to modulate a portion of the incoming light based on electrical data provided by a corresponding driver circuit in EIC 801.

In various implementations, EIC 801 is configured to provide the electrical data and clock signals required to drive the MZM segments in PIC 802. For instance, EIC 801 may receive an input clock signal (e.g., clk0). The input clock signal may be distributed across the MZM segments through one or more clock generation circuits (e.g., iqgen), which produce additional clock signals (e.g., clk1 and clk2) by introducing precise delays (e.g., dt) to the input clock signal (e.g., clk0). In some examples, EIC 801 also generates electrical data signals (e.g., d0, d1, and d2) that correspond to the input data streams intended for modulation. In some cases, EIC 801 further includes one or more driver circuits, such as first driver circuit 804*a*, second driver circuit 804*b*, third driver circuit 804*c*, and/or the like. Each driver circuit may be configured to receive a data signal (e.g., d0, d1, or d2) and a corresponding clock signal (e.g., clk0, clk1, or clk2).

Depending on the implementation, the clock generation circuits (e.g., iqgen) within EIC 801 may perform lane skew calibration to align the clock signals (e.g., clk_I) driving each MZM segment. The lane skew calibration may be embedded within the clock generation hardware and managed by digital algorithms executed by the controller (e.g., a DSP). For instance, separate adjustment of each lane's clk_I delay is enabled by digital control words (e.g., digcal0, digcal1, and digcal2), which configure the clk_I DACs integrated within the clock generation circuits. The digital control words program each DAC to introduce precise delays for the corresponding MZM segment's clk_I signal (e.g., dt=4.8 ps), ensuring each MZM segment's clock can be skewed independently relative to its neighboring segments. By allowing independent control of clk_I delays, system 800 reduces inter-segment timing errors that could degrade the quality of the optical signal.

Figure 8B:
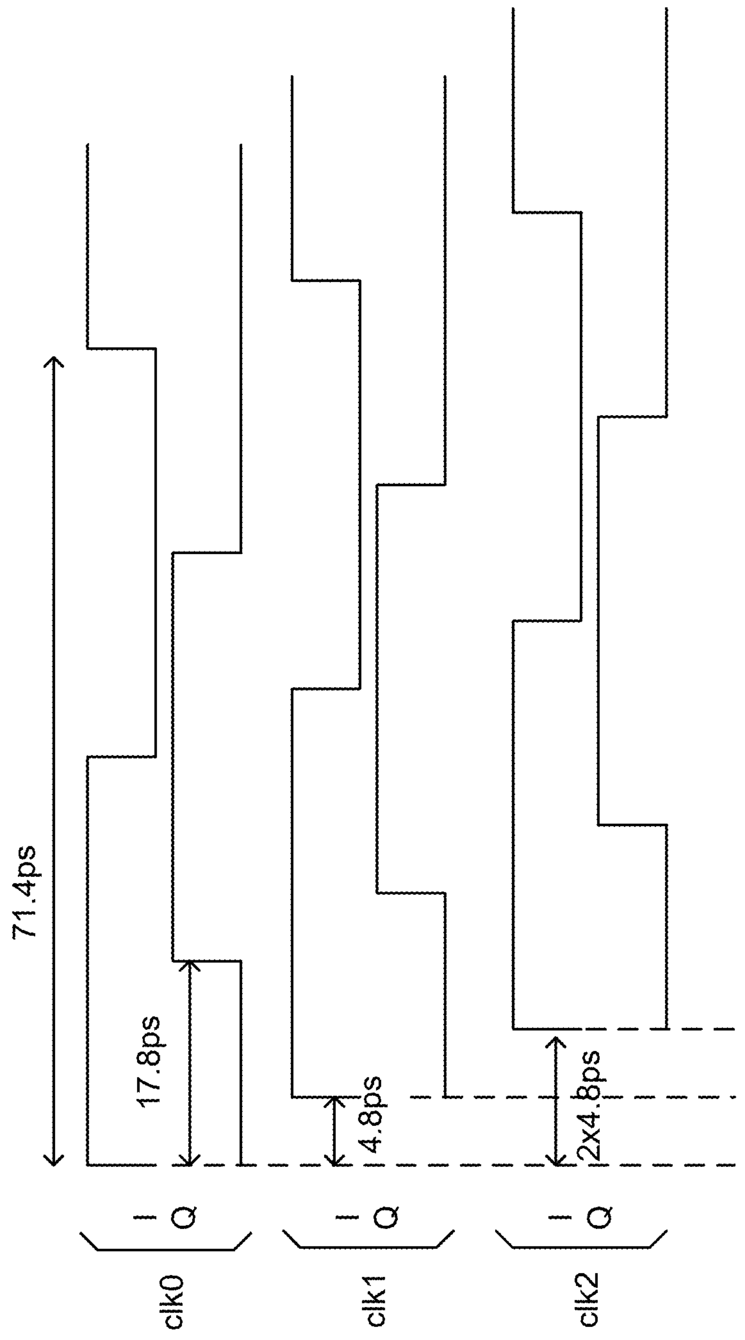
FIG. 8B is a simplified timing diagram illustrating clock signals driving mach-zehnder modulator (MZM) segments, according to embodiments of the subject technology.

FIG. 8B is a simplified timing diagram illustrating clock signals driving Mach-Zehnder Modulator (MZM) segments, according to embodiments of the subject technology. This diagram merely provides an example, which should not unduly limit the scope of the claims. One of ordinary skill in the art would recognize many variations, alternatives, and modifications. As shown, FIG. 8B illustrates clock signals clk0, clk1, and clk2, each of which is generated and distributed to different MZM segments in a co-packaged optical system (e.g., system 800 of FIG. 8A). Each clock signal includes an in-phase component and a quadrature-phase component.

In some examples, the input clock signal clk0 may serve as the reference signal and is used to generate subsequent clock signals (e.g., clk1, clk2) for driving other MZM segments. For instance, the clock signal clk1 is generated by introducing a controlled delay (e.g., dt=4.8 ps) relative to clk0. Similarly, clk2 is generated by applying a cumulative delay (e.g., 2×4.8 ps=9.6 ps) relative to clk0. These delays ensure proper synchronization and alignment of clock edges across the MZM segments. Within each clock signal (e.g., clk0, clk1, clk2), the in-phase and quadrature-phase components may be separated by a fixed delay (e.g., 17.8 ps) to achieve the desired 90-degree phase relationship for I/Q modulation. In some cases, lane skew calibration may be performed by adjusting the in-phase component for each segment, allowing the system to fine-tune the timing of each MZM segment independently.

Figure 9A:
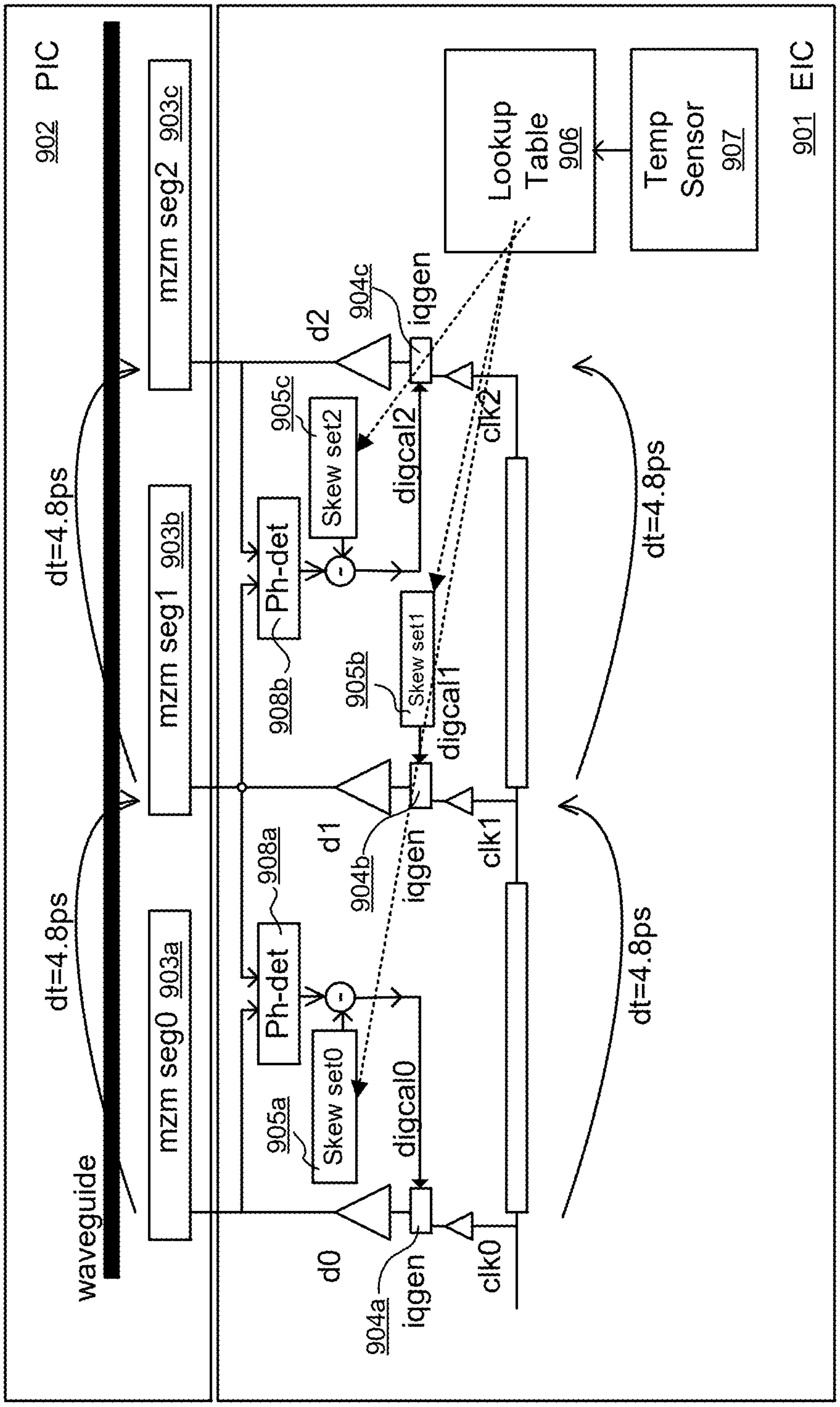
FIG. 9A is a simplified diagram illustrating a co-packaged optical system, according to embodiments of the subject technology.

FIG. 9A is a simplified diagram illustrating a co-packaged optical system 900, according to embodiments of the subject technology. This diagram merely provides an example, which should not unduly limit the scope of the claims. One of ordinary skill in the art would recognize many variations, alternatives, and modifications.

Similar to system 800 of FIG. 8A, system 900 includes EIC 901 and PIC 902. PIC 902 may include one or more MZM segments, such as first MZM segment 903*a*, second MZM segment 903*b*, third MZM segment 903*c*, and/or the like. In some examples, each MZM segment is driven by a corresponding clock signal (e.g., clk0, clk1, clk2) and data signal (e.g., d0, d1, d2) generated and managed by EIC 901. For instance, EIC 901 includes one or more clock generation circuits, such as first clock generation circuit 904*a*, second clock generation circuit 904*b*, third clock generation circuit 904*c*, and/or the like. Each clock generation circuit may be configured to generate clock signals with controlled delays (e.g., dt=4.8 ps) to ensure synchronization across the MZM segments.

In various implementations, system 900 may perform lane skew calibration to align the clock signals driving the MZM segments. For example, the lane skew calibration process includes factory calibration for residual errors and closed-loop skew correction to compensate for temperature and lifetime drift effects. During factory calibration, residual skew errors are measured and corrected to ensure initial alignment. Closed-loop correction is then performed to adjust the skew settings based on real-time operating conditions, compensating for environmental factors such as temperature variations.

Depending on the application, the lane skew calibration process may account for temperature dependency using temperature sensor 907 and LUT 906 stored within EIC 901. LUT 906 may be configured to store pre-calibrated skew set points (e.g., skew set0, skew set1, skew set2) across a range of operating temperatures. For instance, the system may perform batch calibration by measuring skew offsets at various temperature points, adjusting the skew settings to align the optical eye segments, and recording the skew set points along with the corresponding temperature data. Temperature sensor 907 may be configured to measure the real-time operating temperature of the system and provide this information to the controller within EIC 901. Based on the temperature data from temperature sensor 907, the controller retrieves the corresponding skew set points from LUT 906 and applies them to the clock generation circuits.

In some embodiments, a mid-lane (e.g., clk1) may be designated as an anchor point, which serves as a reference for aligning the clock signals for the neighboring lanes (e.g., clk0 and clk2). In some cases, a skew set point (e.g., skew set1) is retrieved from LUT 906 based on real-time temperature readings from temperature sensor 907 and applied to clk1 (e.g., through digcal1) to correct residual skew errors and compensate for temperature variations.

In various examples, phase detectors may be positioned between the lanes to measure the phase difference. For example, first phase detector 908*a* is configured to determine the phase difference between clk0 and clk1, and second phase detector 908*b* is configured to determine the phase difference between clk1 and clk2. The outputs of the phase detectors may be compared against predetermined skew set points (e.g., skew set0, skew set2) stored in LUT 906. These skew set points define the desired alignment for each clock signal relative to the anchor point (e.g., clk1). If the detected phase error exceeds a certain threshold—which may be fixed or programmable, depending on the implementation—the system adjusts the corresponding skew setting (e.g., through digcal0 or digcal2) to align the clock signals with the anchor point (e.g., clk1).

Figure 9B:
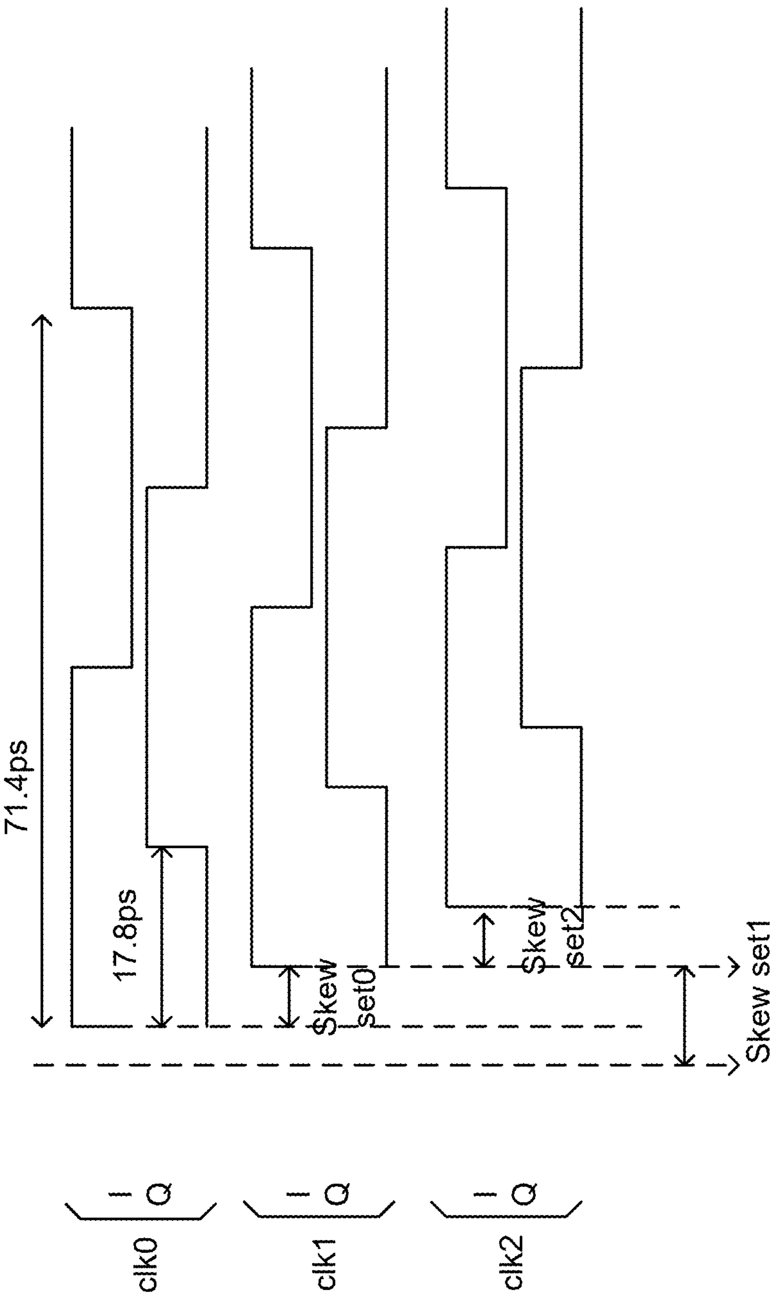
FIG. 9B is a simplified timing diagram illustrating clock signals driving mach-zehnder modulator (MZM) segments, according to embodiments of the subject technology.

FIG. 9B is a simplified timing diagram illustrating clock signals driving mach-zehnder modulator (MZM) segments, according to embodiments of the subject technology. This diagram merely provides an example, which should not unduly limit the scope of the claims. One of ordinary skill in the art would recognize many variations, alternatives, and modifications. As shown, FIG. 9B illustrates clock signals clk0, clk1, and clk2, each of which is generated and distributed to different MZM segments in a co-packaged optical system (e.g., system 900 of FIG. 9A). Each clock signal includes an in-phase (I) component and a quadrature-phase (Q) component.

In some embodiments, lane skew calibration may be performed to fine-tune the timing of the in-phase components for each clock signal. For instance, skew set points (e.g., skew set0, skew set1, and skew set2) may be applied to the corresponding clock signals to adjust their relative timing with respect to an anchor point (e.g., clk1). As shown in FIG. 9B, skew set1 may be applied to clk1 to correct residual skew errors and compensate for temperature variations. Skew set0 and skew set2 may be applied to clk0 and clk2, respectively, to adjust their relative timing to clk1. This calibration ensures that all clock signals are properly aligned, reducing inter-lane skew and maintaining the required timing relationships across the MZM segments.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. An apparatus comprising:

a first delay line configured to receive an input clock signal and generate a first clock signal by providing a first delay to the input clock signal;

a second delay line configured to receive the input clock signal and generate a second clock signal by providing a second delay to the input clock signal;

a phase detector coupled to the first delay line and the second delay line, the phase detector being configured to determine a phase difference between the first clock signal and the second clock signal;

a comparator coupled to the phase detector, the comparator being configured to generate an output signal based on the phase difference; and a controller coupled to the comparator, the controller being configured to adjust the first delay or the second delay based on the output signal.

2. The apparatus of claim 1, further comprising a first digital-to-analog converter (DAC) coupled to the controller and the first delay line, the first DAC is configured to adjust the first delay based on a first control signal from the controller.

3. The apparatus of claim 2, further comprising a second DAC coupled to the controller and the second delay line, the second DAC is configured to adjust the second delay based on a second control signal from the controller.

4. The apparatus of claim 3, wherein the controller is configured to determine a most significant bit (MSB) of the second control signal by comparing the phase difference between the first clock signal and the second clock signal to a first threshold.

5. The apparatus of claim 4, wherein the first threshold is associated with a phase difference of 90 degrees between the first clock signal and the second clock signal.

6. The apparatus of claim 1, wherein the controller is configured to adjust the second delay based on the output signal at a predefined interval.

7. The apparatus of claim 1, further comprising a first circuit configured to correct duty cycle distortion of the input clock signal.

8. The apparatus of claim 1, wherein the controller is configured to adjust the first clock signal relative to a reference clock signal.

9. The apparatus of claim 8, further comprising a memory coupled to the controller, the memory being configured to store a look-up table (LUT), the LUT comprising a first skew set point associated with a first temperature, and the first skew set point being configured to align the first clock signal with the reference clock signal at the first temperature.

10. The apparatus of claim 1, further comprising a temperature sensor coupled to the controller, the temperature sensor being configured to provide temperature data to the controller for adjusting the first delay.

11. An apparatus comprising:

a first delay line configured to receive an input clock signal and generate a first clock signal by providing a first delay to the input clock signal;

a second delay line configured to receive the input clock signal and generate a second clock signal by providing a second delay to the input clock signal;

a phase detector coupled to the first delay line and the second delay line, the phase detector being configured to determine a phase difference between the first clock signal and the second clock signal;

a comparator coupled to the phase detector, the comparator being configured to generate an output signal based on the phase difference; and a controller coupled to the comparator, the controller being configured to generate a first control signal and a second control signal based on the output signal, the first control signal being associated with the first delay, and the second control signal being associated with the second delay.

12. The apparatus of claim 11, further comprising a first digital-to-analog converter (DAC) coupled to the controller and the first delay line, the first DAC being configured to adjust the first delay based on the first control signal.

13. The apparatus of claim 11, further comprising a second DAC coupled to the controller and the second delay line, the second DAC is configured to adjust the second delay based on the second control signal.

14. The apparatus of claim 13, wherein the controller is configured to determine a most significant bit (MSB) of the second control signal by comparing the phase difference between the first clock signal and the second clock signal to a first threshold.

15. The apparatus of claim 11, wherein the controller is configured to adjust the second delay based on the output signal at a predefined interval.

16. An apparatus comprising:

a first delay line configured to receive an input clock signal and generate a first clock signal by providing a first delay to the input clock signal;

a second delay line configured to receive the input clock signal and generate a second clock signal by providing a second delay to the input clock signal;

a phase detector coupled to the first delay line and the second delay line, the phase detector being configured to determine a phase difference between the first clock signal and the second clock signal;

a comparator coupled to the phase detector, the comparator being configured to generate an output signal based on the phase difference; and a controller coupled to the comparator, the controller being configured to generate a first control signal based on the output signal, the first control signal being configured to adjust the first clock signal relative to a reference clock signal.

17. The apparatus of claim 16, further comprising a memory coupled to the controller, the memory being configured to store a look-up table (LUT), the LUT comprising a first skew set point associated with a first temperature, and the first skew set point being configured to align the first clock signal with the reference clock signal at the first temperature.

18. The apparatus of claim 16, further comprising a temperature sensor coupled to the controller, the temperature sensor being configured to provide temperature data to the controller for adjusting the first delay.

19. The apparatus of claim 16, further comprising a first digital-to-analog converter (DAC) coupled to the controller and the first delay line, the first DAC is configured to adjust the first delay based on the first control signal from the controller.

20. The apparatus of claim 16, wherein the controller is configured to adjust the second delay based on the output signal at a predefined interval.

* * * * *